US011915779B2

(12) United States Patent
Nagata

(10) Patent No.: US 11,915,779 B2
(45) Date of Patent: Feb. 27, 2024

(54) SENSE AMPLIFIER SCHEMES FOR ACCESSING MEMORY CELLS

(71) Applicant: Micron Technology, Inc., Boise, ID (US)

(72) Inventor: Kyoichi Nagata, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/685,196

(22) Filed: Mar. 2, 2022

(65) Prior Publication Data

US 2022/0383912 A1     Dec. 1, 2022

Related U.S. Application Data

(62) Division of application No. 16/504,854, filed on Jul. 8, 2019, now Pat. No. 11,270,740, which is a division
(Continued)

(51) Int. Cl.
*G11C 11/22* (2006.01)
*G11C 7/06* (2006.01)
(Continued)

(52) U.S. Cl.
CPC ............... *G11C 7/08* (2013.01); *G11C 7/065* (2013.01); *G11C 7/12* (2013.01); *G11C 11/22* (2013.01);
(Continued)

(58) Field of Classification Search
CPC .............. G11C 7/08; G11C 7/12; G11C 11/22
(Continued)

(56) References Cited

U.S. PATENT DOCUMENTS 5,677,865 A * 10/1997 Seyyedy ............... G11C 11/22
365/210.1
6,356,476 B1     3/2002 Kang
(Continued)

FOREIGN PATENT DOCUMENTS

CN          101061550 A      10/2007
CN          103956185 A       7/2014
(Continued)

OTHER PUBLICATIONS

China National Intellectual Property Administration, "First Office Action," and "First Search" issued in connection with Chinese Patent Application No. 201810924300.7, dated Sep. 15, 2021 (24 pages with Translation).

*Primary Examiner* — Anthan Tran
(74) *Attorney, Agent, or Firm* — Holland & Hart LLP

(57) ABSTRACT

A sense component of a memory device in accordance with the present disclosure may selectively employ components having a relatively high voltage isolation characteristic in a portion of the sense component associated with relatively higher voltage signals (e.g., signals associated with accessing a ferroelectric random access memory (FeRAM) cell), and components having a relatively low voltage isolation characteristic in a portion of the sense component associated with relatively lower voltage signals (e.g., input/output signals according to some memory architectures). Voltage isolation characteristics may include isolation voltage, activation threshold voltage, a degree of electrical insulation, and others, and may refer to such characteristics as a nominal value or a threshold value. In some examples the sense component may include transistors, and the voltage isolation characteristics may be based at least in part on gate insulation thickness of the transistors in each portion of the sense component.

14 Claims, 13 Drawing Sheets

Related U.S. Application Data of application No. 15/676,721, filed on Aug. 14, 2017, now Pat. No. 10,388,335.

(51) Int. Cl.
  *G11C 7/08* (2006.01)
  *G11C 7/12* (2006.01)
  *G11C 11/4091* (2006.01)
  *G11C 7/14* (2006.01)
  *G11C 11/406* (2006.01)
  *G11C 11/4093* (2006.01)

(52) U.S. Cl.
  CPC ........ *G11C 11/221* (2013.01); *G11C 11/2273* (2013.01); *G11C 7/14* (2013.01); *G11C 11/406* (2013.01); *G11C 11/4091* (2013.01); *G11C 11/4093* (2013.01); *G11C 2207/002* (2013.01); *G11C 2207/06* (2013.01)

(58) Field of Classification Search
  USPC .......................................................... 365/207
  See application file for complete search history.

(56) References Cited

U.S. PATENT DOCUMENTS

| | | |
|---|---|---|
| 7,112,857 B2 | 9/2006 | Liaw |
| 8,705,282 B2 | 4/2014 | Van et al. |
| 8,767,433 B2 | 7/2014 | Kurjanowicz et al. |
| 9,093,168 B2 | 7/2015 | Kawashima |
| 2002/0154561 A1 | 10/2002 | Graaff |
| 2006/0006440 A1* | 1/2006 | Liaw .................. H01L 29/4916 257/296 |
| 2009/0279371 A1 | 11/2009 | Abe et al. |
| 2012/0182782 A1 | 7/2012 | Kurjanowicz et al. |
| 2013/0107632 A1 | 5/2013 | Van et al. |
| 2013/0229849 A1 | 9/2013 | Kawashima |
| 2014/0029326 A1 | 1/2014 | Qidwai |

FOREIGN PATENT DOCUMENTS

| | | |
|---|---|---|
| CN | 104603759 A | 5/2015 |
| CN | 105074828 A | 11/2015 |
| CN | 106663459 A | 5/2017 |

* cited by examiner

SENSE AMPLIFIER SCHEMES FOR ACCESSING MEMORY CELLS

CROSS REFERENCE

The present application for patent is a divisional of U.S. patent application Ser. No. 16/504,854 by Nagata, entitled "Sense Amplifier for Accessing Memory Cells," filed Jul. 8, 2019, which is a divisional of U.S. patent application Ser. No. 15/676,721 by Nagata, entitled "Sense Amplifier for Accessing Memory Cells," filed Aug. 14, 2017, each of which is assigned to the assignee hereof, and each of which is expressly incorporated by reference in its entirety herein.

BACKGROUND

The following relates generally to memory systems and more specifically to sense amplifier schemes for accessing memory cells.

Memory devices are widely used to store information in various electronic devices such as computers, wireless communication devices, cameras, digital displays, and the like. Information is stored by programing different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases non-volatile memory may use similar device architectures as volatile memory but may have non-volatile properties by employing such physical phenomena as ferroelectric capacitance or different material phases.

Improving memory devices, may include increasing memory cell density, increasing read/write speeds, increasing reliability, increasing data retention, reducing power consumption, or reducing manufacturing costs, among other metrics. In some cases, operation of a memory device may require a relatively high voltage for access operations, (e.g., read, write, re-write, or refresh operations) but a sense amplifier supporting the relatively high voltage may be associated with relatively poor manufacturing or operational tolerances (e.g., high variability) or relatively high power consumption.

DETAILED DESCRIPTION

In some memory systems, accessing a memory cell may require relatively high voltage signals, but components supporting the relatively high voltage may be associated with relatively poor manufacturing or operational tolerances or relatively high power consumption. A sense amplifier of a memory device, which may also be referred to as a sense component, in accordance with the present disclosure may provide greater design flexibility by selectively employing components having a relatively high voltage isolation characteristic in a portion of the sense component having relatively higher voltage signals, and components having a relatively low voltage isolation characteristic in a portion of the sense component having relatively lower voltage signals. Components having the relatively low voltage isolation characteristic may be associated with favorable manufacturing or operational tolerances, or relatively lower power consumption. Thus, as described herein, selectively employing the components having the relatively high voltage isolation may support the relatively higher voltage signals of the sense component, and selectively employing the components having the relatively low voltage isolation characteristic may improve the sense margins or operational efficiency when compared with a sense component that employs only components having the relatively high voltage isolation characteristic.

Features of the disclosure introduced above are further described below in the context of a memory array. Specific examples are then described for various sense amplifier schemes for accessing memory cells. These and other features of the disclosure are further illustrated by and described with reference to apparatus diagrams, system diagrams, and method diagrams that relate to sense amplifier schemes for accessing a memory cell.

Figure 1:
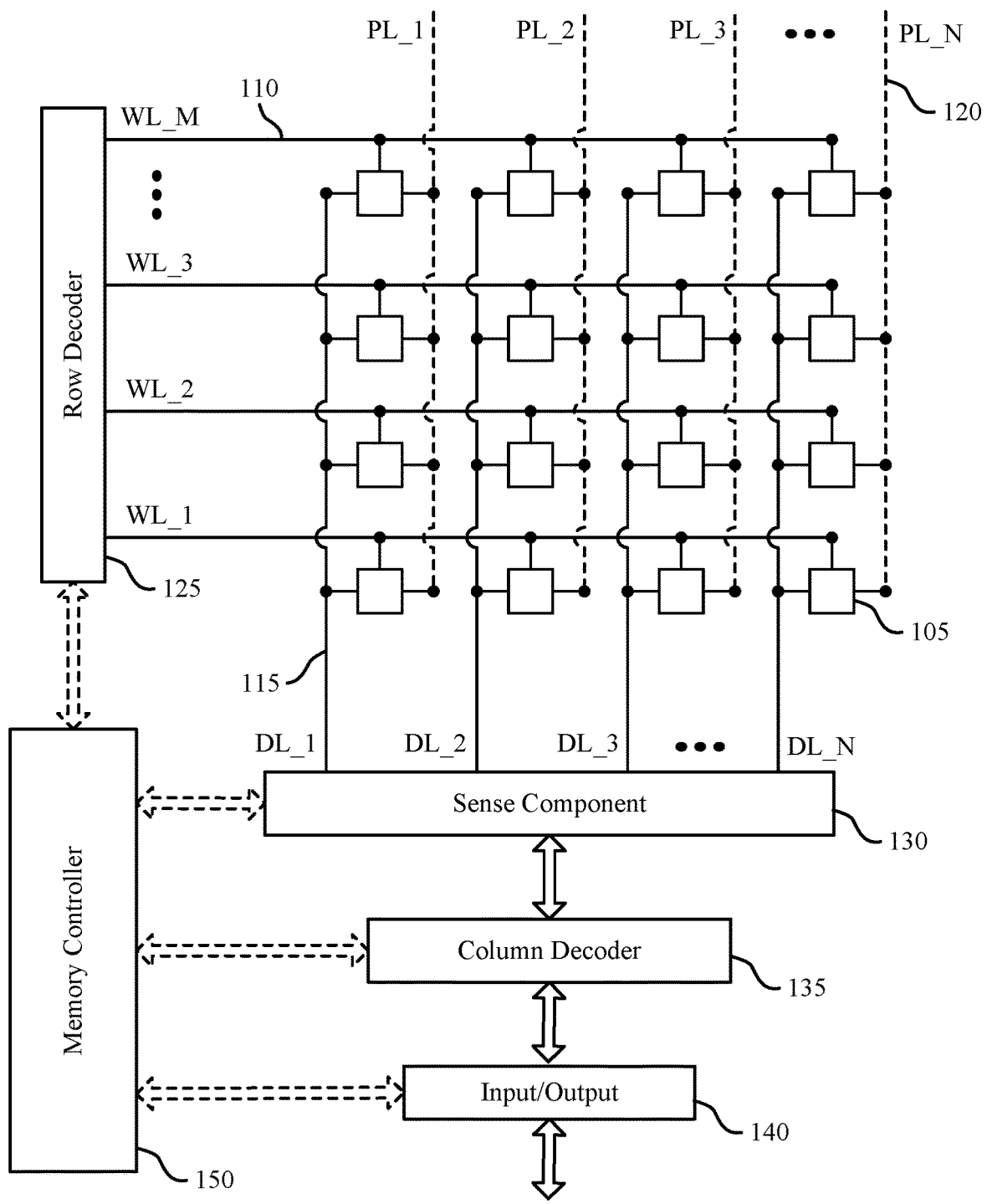
FIG. 1 illustrates an example memory device that may support sense amplifier schemes for accessing memory cells in accordance with various embodiments of the present disclosure.

FIG. 1 illustrates an example memory device 100 that may support sense amplifier schemes for accessing a memory cell in accordance with various embodiments of the present disclosure. Memory device 100 may also be referred to as an electronic memory apparatus. Memory device 100 includes memory cells 105 that are programmable to store different logic states. In some cases a memory cell 105 may be programmable to store two logic states, denoted a logic 0 and a logic 1. In some cases, a memory cell 105 may be programmable to store more than two logic states.

In some examples a memory cell 105 may store an electrical charge representative of the programmable logic states in a capacitive memory element. For example, a charged and uncharged capacitor of a memory cell 105 may represent two logic states, respectively, or a positively charged and a negatively charged capacitor of a memory cell 105 may represent two logic states, respectively. DRAM architectures may use such designs, and the capacitor employed may include a dielectric material with linear or para-electric polarization properties as the insulator. In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states. Ferroelectric materials have non-linear polarization properties including those discussed in further detail with reference to FIG. 3.

Memory device 100 may include a three-dimensional (3D) memory array, where a plurality of two-dimensional (2D) memory arrays (e.g., decks) are formed on top of one another. Such an arrangement may increase the number of memory cells 105 that may be placed or created on a single die or substrate as compared with 2D arrays, which in turn may reduce production costs or increase the performance of the memory device 100, or both. The decks may be separated by an electrically insulating material. Each deck may be aligned or positioned so that memory cells 105 may be approximately aligned with one another across each deck, forming a stack of memory cells 105.

According to the example of FIG. 1, each row of memory cells 105 is coupled with one of a plurality of first access lines 110 (e.g., a word line (WL), such as one of WL_1 through WL_M), and each column of memory cells 105 is coupled with one of a plurality of second access lines 115 (e.g., a digit line (DL), such as one of DL_1 through DL_N). Thus, one memory cell 105 may be located at the intersection of one of the first access lines 110 and one of the second access lines 115. This intersection may be referred to as an address of the memory cell 105. References to word lines and bit lines, or their analogues, are interchangeable without loss of understanding or operation. In some cases, first access lines 110 and second access lines 115 may be substantially perpendicular to one another in the memory device 100 (e.g., when viewing a plane of a deck of the memory device 100, as shown in FIG. 1). Although the access lines described with reference to FIG. 1 are shown as direct lines between memory cells 105 and coupled components, access lines may include other circuit elements, such as capacitors, resistors, transistors, amplifiers, and others, which may be used to support sensing operations including those described herein.

In some architectures, the logic storing component (e.g., a capacitive memory element) of a memory cell 105 may be electrically isolated from a second access line 115 by a selection component. A first access line 110 may be coupled with and may control the selection component of the memory cell 105. For example, the selection component may be a transistor and the first access line 110 may be coupled with a gate of the transistor. Activating the first access line 110 of a memory cell 105 may result in an electrical connection or closed circuit between the logic storing component of the memory cell 105 and its corresponding second access line 115. The second access line 115 may then be accessed to read and/or write the memory cell 105.

In some examples, memory cells 105 may also be coupled with one of a plurality of third access lines 120 (e.g., a plate line (PL), such as one of PL_1 through PL_N). In some examples the plurality of third access lines 120 may couple memory cells 105 with a voltage source for various sensing and/or writing operations including those described herein. For example, when a memory cell 105 employs a capacitor for storing a logic state, a second access line 115 may provide access to a first terminal of the capacitor, and a third access line 120 may provide access to a second terminal of the capacitor. Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, and/or a current to the respective access line. Access lines 110, 115, and 120 may be made of conductive materials, such as metals (e.g., copper (Cu), silver (Ag), aluminum (Al), gold (Au), tungsten (W), or titanium (Ti)), metal alloys, carbon, or other conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state of the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples a memory cell 105 may be accessed by activating a first access line 110 and a second access line 115.

Upon accessing, a memory cell 105 may be read, or sensed, by a sense component 130. For example, sense component 130 may be configured to determine the stored logic state of a memory cell 105 based on a signal generated by accessing the memory cell 105. The signal may include a voltage, an electrical charge, an electrical current, or a combination thereof, and sense component 130 may include voltage sense amplifiers, charge sense amplifiers, current sense amplifiers, or a combination thereof. For example, a voltage may be applied to a memory cell 105 having a capacitive memory element (e.g., using the corresponding first access line 110, second access line 115, and/or third access line 120), and a magnitude of the resulting flow of charge and/or voltage may depend on the stored charge and/or polarization of the capacitive memory element.

Sense component 130 may include various transistors or amplifiers used to detect and amplify a signal, which may be referred to as latching. The detected logic state of a memory cell 105 may then be output via an input/output component 140. In some cases, sense component 130 may be a part of column decoder 135 or row decoder 125. In some cases, sense component 130 may be coupled with or in electronic communication with column decoder 135, row decoder 125, and/or memory controller 150.

A memory cell 105 may also be set, or written, by activating the relevant first access line 110, second access line 115, and/or third access line 120—i.e., a logic state may be stored in the memory cell 105. Column decoder 135 or row decoder 125 may accept data, for example via input/output component 140, to be written to the memory cells 105. In the case of a capacitive memory element, a memory cell 105 may be written by applying a voltage to the capacitor, and then isolating the capacitor (e.g., isolating the capacitor from a voltage source used to write the memory cell 105). In the case of ferroelectric memory, a ferroelectric memory element (e.g., a ferroelectric capacitor) of a memory cell 105 may written by applying a voltage with a magnitude high enough to polarize the ferroelectric memory element (e.g., applying a saturation voltage), and the ferroelectric memory element may be isolated (e.g., floating), or a zero net voltage may be applied across the ferroelectric memory element (e.g., grounding or virtually grounding the ferroelectric memory element).

In some memory architectures, accessing the memory cell 105 may degrade or destroy the stored logic state. Thus, re-write or refresh operations may be performed to return a programmed logic state to memory cell 105 after such accessing. In DRAM, for example, a logic-storing capacitor of a memory cell 105 may be partially or completely discharged during a sense operation, corrupting the stored logic state. So the logic state may be re-written after a sense operation. In some examples, activating a single access line (e.g., a first access line 110, a second access line 115, or a third access line 120) may result in the discharge of all memory cells 105 along that access line. Thus, in some examples all memory cells 105 in a row or column may need to be re-written after an access operation. But, in some alternative examples, when accessing a memory cell 105 having non-volatile properties (e.g., a FeRAM memory cell), accessing the memory cell 105 may not destroy the logic state and, thus, the memory cell 105 may not require re-writing after accessing.

Some memory architectures, including DRAM, may lose their stored logic states over time unless they are periodically refreshed (e.g., by an voltage source external to the memory cells 105). For example, a charged capacitor may become discharged over time through leakage currents, resulting in the loss of the stored charge. The refresh rate of such memory devices may be relatively high, e.g., tens of refresh operations per second for DRAM, which may result in significant power consumption. With increasingly larger memory arrays, such power consumption may inhibit the deployment or operation of memory arrays (e.g., power supplies, heat generation, or material limits), especially for devices that rely on a finite source of energy, such as a battery. Memory cells 105 having memory elements with non-volatile properties may result in improved performance relative to other memory architectures. For example, FeRAM may offer comparable read/write speeds as DRAM but may have non-volatile properties that allow for reduced power consumption and/or increased cell density.

The memory controller 150 may control the operation (e.g., read, write, re-write, refresh operations) of memory cells 105 through the various components, for example, initiating operations of and/or receiving information from the row decoder 125, column decoder 135, and sense component 130, and others components as described herein. In some cases, one or more row decoder 125, one or more column decoder 135, one or more sense component 130, and/or one or more input/output component 140 may be co-located with the memory controller 150. Memory controller 150 may generate row and column address signals in order to activate a desired first access line 110, second access line 115, and/or third access line 120. Furthermore, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state Memory controller 150 may also generate and/or control application of various voltages, charges, or currents used during the operation of the memory device 100 (e.g., via various voltage supplies, charge supplies, current supplies, ground points, or virtual ground points). The amplitude, shape, or duration of an applied voltage, charge, or current discussed herein may be adjusted or varied and may be different for the various operations discussed in operating memory device 100. The memory controller 150 may also generate and/or control application of various logic signals (e.g., via various voltage supplies or logic controllers), which may control various switching components in accordance with embodiments of the present disclosure.

In some examples of a memory device 100, the voltage magnitude applied to a memory cell 105 for access operations (e.g., sensing, writing, re-writing, or refreshing operations) may be the same (e.g., within a same voltage magnitude) as the voltage associated with the input/output component 140. For example, some legacy DRAM architectures may use a 1V signal magnitude for input/output operations via an input/output component 140, which may be substantially within the same voltage magnitude as is used for accessing a DRAM memory cell 105. Accordingly, a sense component 130 supporting such a memory device may have components (e.g., transistors, amplifiers, switching components, selection components, or conductors) that are all rated for the substantially same voltage magnitude associated with the access operations and the input/output operations.

In some examples of a memory device 100, the voltage magnitude applied to a memory cell 105 for access operations may be substantially different from the voltage associated with the input/output component 140. For example, some FeRAM architectures may use a 1V signal for input/output operations via an input/output component 140 (e.g., similar to those used for legacy DRAM architectures), which may be substantially lower in magnitude than voltages used for accessing a FeRAM memory cell 105 (e.g., a saturation voltage for an FeRAM memory cell 105 or a read voltage for an FeRAM memory cell 105). In other words, accessing an FeRAM memory cell 105 may require substantially higher voltage than is used for input/output operations of the memory device 100. Thus, some memory devices 100 may include a sense component 130 having components that are all rated for the relatively higher voltage of the access operations.

Components that are rated for the relatively higher voltage of the access operations may be associated with relatively poor manufacturing or operational tolerances, such as a greater statistical range of threshold voltages for a particular nominal transistor design. Thus, a sense component 130 having components that are all rated for a relatively higher voltage magnitude (e.g., a sense component associated with some FeRAM architectures) may be associated with relatively poor (e.g., narrow) sense margins when compared with a sense component 130 having components that are all rated for a relatively lower voltage magnitude (e.g., a sense component associated with some legacy DRAM architectures). Further, components that are rated for the relatively higher voltage of the access operations may also be associated with higher power consumption (e.g., due to power consumption of operating the components or supplying the relatively higher voltage). Thus, a sense component 130 having components that are all rated for a relatively higher voltage magnitude may also be associated with relatively poor power efficiency when compared with a sense component 130 having components that are all rated for a relatively lower voltage magnitude.

In accordance with embodiments of the present disclosure, a sense component 130 may be divided into a first portion having components associated with a first voltage isolation characteristic (e.g., a first voltage rating), and a second portion having components associated with a second voltage isolation characteristic that is different from the first voltage isolation characteristic (e.g., a second voltage rating, higher or lower than the first voltage rating). Such a sense component 130 may support relatively higher voltage signals in one of the portions, and isolate the other of the portions from the relatively higher voltage signals so that components of the other of the portions may have a lower voltage rating. In some examples this may support using components with relatively improved manufacturing or operational tolerances.

In other words, a sense component 130 in may combine components having a relatively high voltage rating to support relatively high voltage signals with components having a relatively low voltage rating and relatively narrow tolerances to support relatively broad sense margins (e.g., broader margins for determining whether a memory cell 105 stores a particular logic state). Additionally or alternatively, in some examples this may support using components with relatively lower power consumption. So a sense component 130 may combine components having a relatively high voltage rating to support relatively high voltage signals with components having a relatively low voltage rating and relatively low power consumption to support relatively improved power efficiency.

Figure 2:
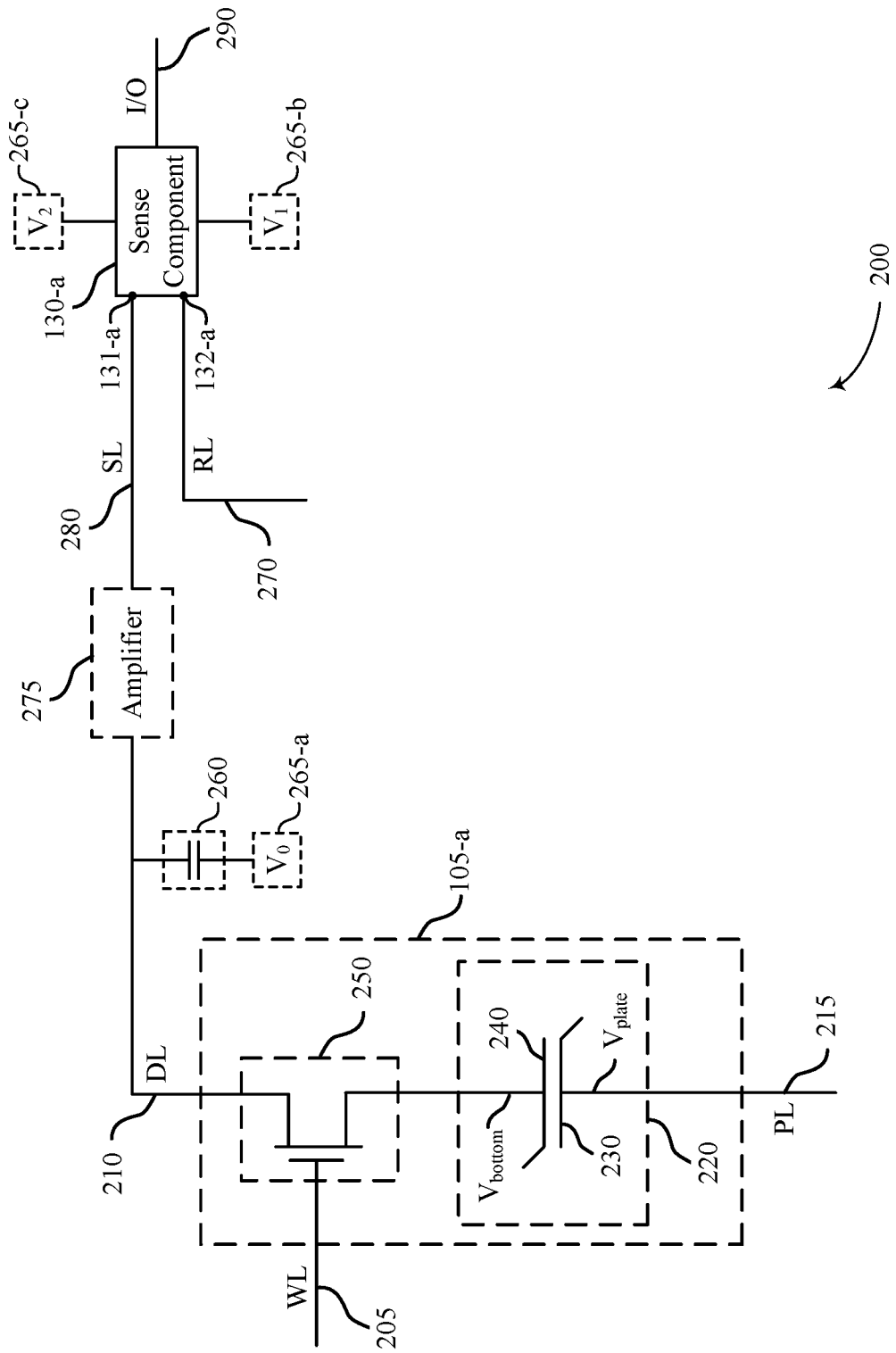
FIG. 2 illustrates an example circuit that may support sense amplifier schemes for accessing memory cells in accordance with various embodiments of the present disclosure.

FIG. 2 illustrates an example circuit 200 that may support sense amplifier schemes for accessing memory cells in accordance with various embodiments of the present disclosure. Circuit 200 includes a memory cell 105-*a* and a sense component 130-*a*, which may be examples of a memory cell 105 and a sense component 130 described with reference to FIG. 1. Circuit 200 may also include a word line 205, a digit line 210, and a plate line 215, which in some examples may correspond to a first access line 110, a second access line 115, and a third access line 120, respectively, as described with reference to FIG. 1. The circuit 200 may also include a reference line 270 used by the sense component 130-*a* to determine a stored logic state of the memory cell 105-*a*. However, other configurations of access lines and/or reference lines are possible in accordance with various embodiments of the present disclosure.

Memory cell 105-*a* may include a logic storage component (e.g., a memory element), such as capacitor 220 that has a first plate, cell plate 230, and a second plate, cell bottom 240. Cell plate 230 and cell bottom 240 may be capacitively coupled through a dielectric material positioned between them (e.g., in a DRAM application), or capacitively coupled through a ferroelectric material positioned between them (e.g., in a FeRAM application). Cell plate 230 may be associated with a voltage $V_{plate}$, and cell bottom may be associated with a voltage $V_{bottom}$, as illustrated in circuit 200. The orientation of cell plate 230 and cell bottom 240 may be flipped without changing the operation of memory cell 105-*a*. Cell plate 230 may be accessed via plate line 215 and cell bottom 240 may be accessed via digit line 210. As described herein, various states may be stored by charging, discharging, and/or polarizing the capacitor 220.

Capacitor 220 may be in electronic communication with digit line 210, and the stored logic state of capacitor 220 may be read or sensed by operating various elements represented in circuit 200. For example, the memory cell 105-*a* may also include a selection component 250, and the capacitor 220 can be coupled with digit line 210 when selection component 250 is activated, and the capacitor 220 can be isolated from digit line 210 when selection component 250 is deactivated. Activating selection component 250 may be referred to as selecting memory cell 105-*a*, and deactivating selection component 250 may be referred to as deselecting memory cell 105-*a*. In some cases, selection component 250 is a transistor and its operation is controlled by applying an activation voltage to the transistor gate, where the voltage for activating the transistor (e.g., the voltage between the transistor gate terminal and the transistor source terminal) is greater than the threshold voltage magnitude of the transistor. The word line 205 may be used to activate the selection component 250. For example, a selection voltage applied to the word line 205 (e.g., a word line logic signal) may be applied to the gate of a transistor of selection component 250, which may connect capacitor 220 with the digit line 210 (e.g., providing a conductive path between the capacitor 220 and the digit line 210.

In other examples, the positions of the selection component 250 and the capacitor 220 in the memory cell 105-*a* may be switched, such that selection component 250 is coupled between plate line 215 and cell plate 230, and the capacitor 220 is coupled between digit line 210 and the other terminal of selection component 250. In such an embodiment, the selection component 250 may remain in electronic communication with digit line 210 through capacitor 220. This configuration may be associated with alternative timing and biasing for access operations.

In examples that employ a ferroelectric capacitor 220, the capacitor 220 may not fully discharge upon connection to digit line 210. In various schemes, to sense the logic state stored by a ferroelectric capacitor 220, a voltage may be applied to plate line 215 and/or digit line 210, and the word line 205 may be biased to select memory cell 105-a. In some cases, the plate line 215 and/or digit line 210 may be virtually grounded and then isolated from the virtual ground, which may be referred to as a floating condition, prior activating the word line 205. Operation of the memory cell 105-a by varying the voltage to cell plate 230 (e.g., via the plate line 215) may be referred to as "moving cell plate." Biasing the plate line 215 and/or digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of capacitor 220—e.g., whether the initial logic state stored a logic 1 or a logic 0. In some schemes the change in the stored charge of the capacitor may cause a change in the voltage of the digit line 210, which may be used by the sense component 130-a to determine the stored logic state of the memory cell 105-a.

Digit line 210 may connect many memory cells 105, and the digit line 210 may have a length that results in a non-negligible intrinsic capacitance 260 (e.g., on the order of picofarads (pF)), which may couple the digit line with a voltage source 265-a, which may represent a common ground or virtual ground voltage, or the voltage of an adjacent access line of the circuit 200 (not shown). Although illustrated as a separate component in FIG. 2, the intrinsic capacitance 260 may be associated with properties distributed throughout the digit line 210.

For example, the intrinsic capacitance may depend on physical characteristics of the digit line 210, including conductor dimensions (e.g., length, width, and/or thickness) of the digit line 210. Thus, a change in voltage of digit line 210 after selecting the memory cell 105-a may depend on the net capacitance of the digit line 210. That is, as charge flows through the digit line 210, some finite charge may be stored in the digit line 210 (e.g., in the intrinsic capacitance 260 or any other capacitance coupled with the digit line 210), and the resulting voltage of the digit line 210 may depend on the net capacitance of the digit line 210. The resulting voltage of digit line 210 after selecting the memory cell 105-a may be compared to a reference (e.g., a voltage of reference line 270) by the sense component 130-a in order to determine the logic state that was stored in the memory cell 105-a. Other operations may be used to support selecting and/or sensing the memory cell 105-a, including operations for supporting sense amplifier schemes for accessing a memory cell as described herein.

In some examples, the circuit 200 may include an amplifier 275, which may amplify signals of the digit line 210 prior to a sensing operation. The amplifier 275 may include, for example, a transistor, a cascode, or any other charge or voltage amplifier. In some examples, the amplifier 275 may refer to a charge transfer sensing amplifier (CTSA). In examples with an amplifier 275, a line between the sense component 130-a and the amplifier 275 may be referred to as a signal line (e.g., signal line 280). In examples without an amplifier 275, the digit line 210 may connect directly with the sense component 130-a. Although the digit line 210 and the signal line 280 are identified as separate lines, the digit line 210, the signal line 280, and any other lines connecting a memory cell 105 with a sense component 130 may be referred to as a single access line in accordance with the present disclosure. Constituent portions of such an access line may be identified separately for the purposes of illustrating intervening components and intervening signals in various example configurations.

Sense component 130-a may include various transistors or amplifiers to detect and amplify a difference in signals, which may be referred to as latching. For example, sense component 130-a may include a sense amplifier that receives and compares the voltage of digit line 210 (e.g., as stored or latched at a first terminal 131-a) with a reference voltage of the reference line 270 (e.g., as stored or latched at a second terminal 132-a). An output of the sense amplifier may be driven to a higher (e.g., a positive) or a lower (e.g., negative or ground) voltage based on the comparison at the sense amplifier. For example, if the digit line 210 (or signal line 280, where applicable) coupled with the sense component 130-a has a lower voltage than the reference line 270, the output of the sense component 130-a may be driven to a relatively lower voltage of a first sense component voltage source 265-b (e.g., a voltage of $V_1$, which may be a ground voltage substantially equal to $V_0$, or a negative voltage, for example).

The sense component 130-a may latch the output of the sense amplifier to determine the logic state stored in the memory cell 105-a (e.g., detecting a logic 0 when the digit line 210 has a lower voltage than the reference line 270. If the digit line 210 (or signal line 280, where applicable) coupled with the sense component 130-a has a higher voltage than the reference line 270, the output of the sense component 130-a may be driven to the voltage of a second sense component voltage source 265-c (e.g., a voltage of $V_2$). The sense component 130-a may latch the output of the sense amplifier to determine the logic state stored in the memory cell 105-a (e.g., detecting a logic 1 when the digit line 210 has a higher voltage than the reference line 270). The latched output of the amplifier, corresponding to the detected logic state of memory cell 105-a, may then be output via an input/output (I/O) line 290 (e.g., through a column decoder 135 via input/output component 140 described with reference to FIG. 1).

To perform a write operation on the memory cell 105-a, a voltage may be applied across the capacitor 220. Various methods may be used. In one example, the selection component 250 may be activated through the word line 205 in order to electrically connect the capacitor 220 to the digit line 210. A voltage may be applied across capacitor 220 by controlling the voltage of cell plate 230 (e.g., through plate line 215) and cell bottom 240 (e.g., through digit line 210). For example, to write a logic 0, cell plate 230 may be taken high (e.g., applying a positive voltage to plate line 215), and cell bottom 240 may be taken low (e.g., virtually grounding or applying a negative voltage to digit line 210). The opposite process may be performed to write a logic 1, where cell plate 230 is taken low and cell bottom 240 is taken high. In some cases the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples the sense component 130-a may be used to perform the write operations, which may include coupling the first sense component voltage source 265-b or the second sense component voltage source 265-c with the digit line.

The circuit 200, including the sense component 130-a, the selection component 250, or the amplifier 275, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal). In some examples the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In various examples where a n-type transistor is employed as a switching component, the voltage of a logical signal applied to the gate terminal may be selected in order to operate the transistor at a particular working point (e.g., in a saturation region or in an active region).

In some examples the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal). In some examples the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In various examples where an p-type transistor is employed as a switching component, the voltage of a logical signal applied to the gate terminal may be selected in order to operate the transistor at a particular working point (e.g., in a saturation region or in an active region).

In some examples the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In various examples the transistor(s) may be formed on a substrate that is dedicated to a particular component of the circuit 200 (e.g., a substrate for the sense component 130-a, a substrate for the amplifier 275, or a substrate for the memory cell 105-a), or the transistor(s) may be formed on a substrate that is common for particular components of the circuit 200 (e.g., a substrate that is common for the sense component 130-a, the amplifier 275, and the memory cell 105-a). Some FETs may have a metal portion including aluminum or other metal, but some FETS may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

The sense component 130-a may be divided into a first portion coupled with the signal line 280 (or directly with a digit line 210) and having components associated with a first voltage isolation characteristic (e.g., a first voltage rating), and a second portion coupled with the input/output line 290 and having components associated with a second voltage isolation characteristic that is different from the first voltage isolation characteristic (e.g., a second voltage rating, higher or lower than the first voltage rating). For example, sense component 130-a may support relatively lower voltage signals in a portion coupled with the first sense component voltage source 265-b and the input/output line 290, and may support relatively higher voltage signals in a different portion coupled with the second sense component voltage source 265-c and the signal line 280 and the reference line 270.

The portion of the sense component 130-a that is associated with the relatively higher voltage signals may include a boundary portion that isolates the relatively higher voltage signals from the portion of the sense component 130-a that is associated with relatively lower voltage signals, so that components of the portion of the sense component 130-a that is associated with the relatively lower voltage signals may employ components having a lower voltage isolation characteristic. Components having the lower voltage isolation characteristic may be associated with relatively improved manufacturing or operational tolerances or relatively lower power consumption. In other words, a sense component 130 may selectively combine components having a relatively high voltage isolation characteristic to support relatively high voltage signals with components having a relatively low voltage isolation characteristic to support relatively broad sense margins or relatively high efficiency.

Figure 3:
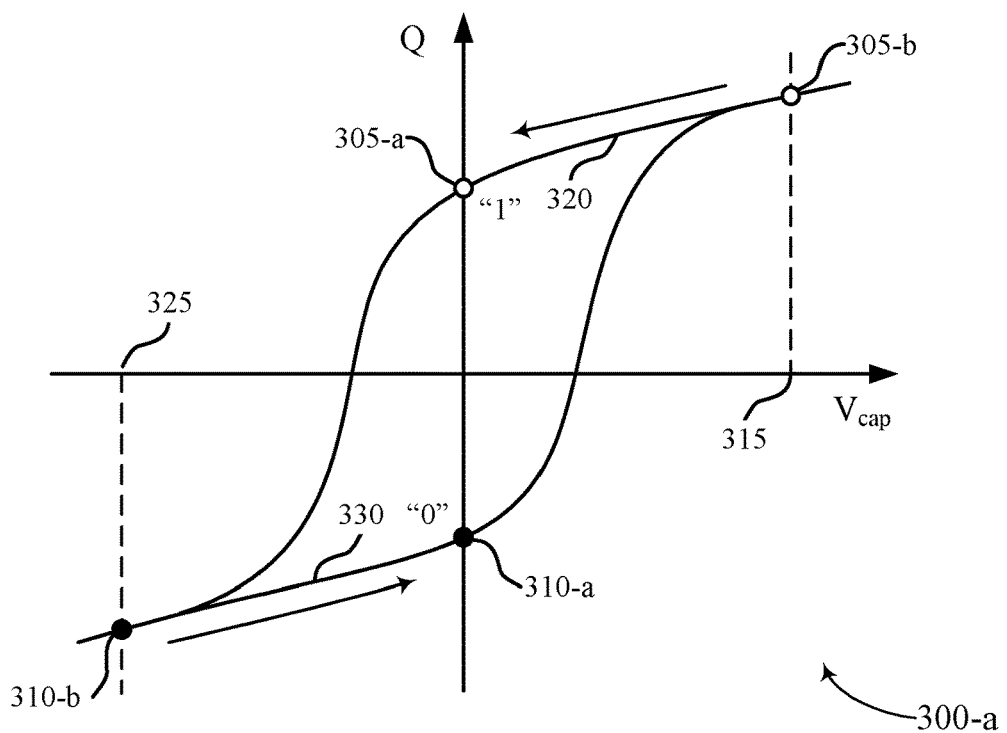
FIG. 3 illustrates an example of non-linear electrical properties with hysteresis plots for a memory cell that may support sense amplifier schemes for accessing memory cells in accordance with various embodiments of the present disclosure.
Figure 3:
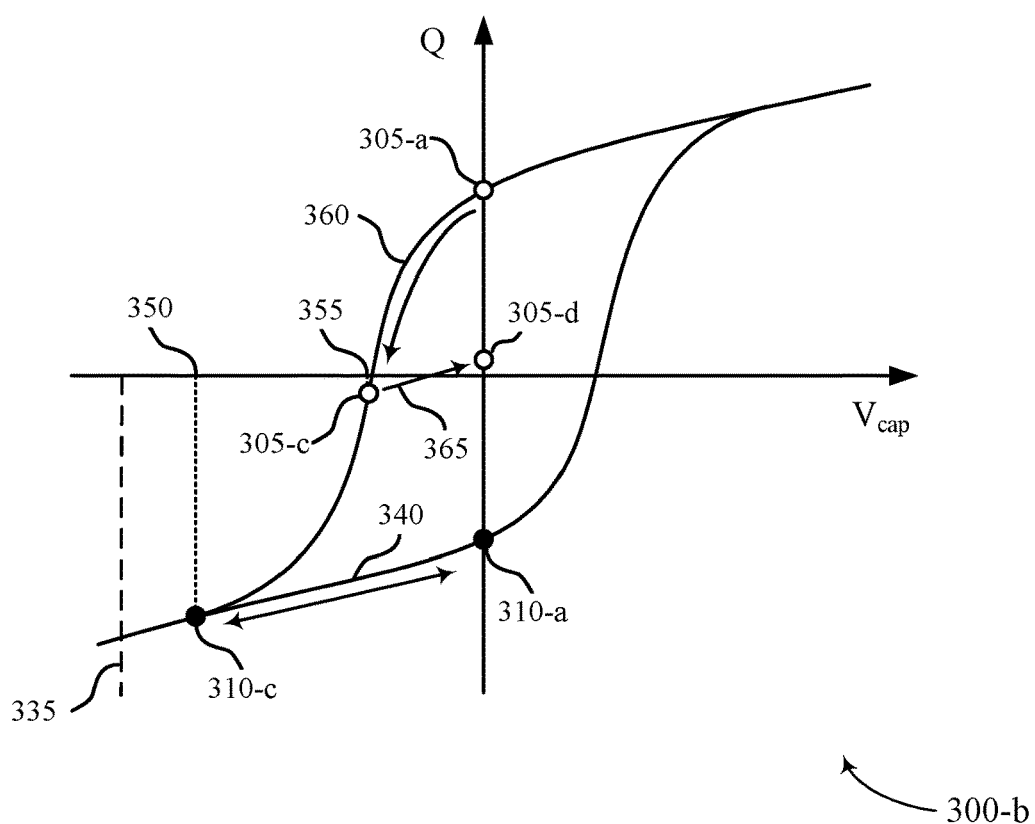

FIG. 3 illustrates an example of non-linear electrical properties with hysteresis plots 300-a and 300-b for a memory cell 105 that may support sense amplifier schemes for accessing memory cells in accordance with various embodiments of the present disclosure. Hysteresis plots 300-a and 300-b may illustrate an example writing process and reading process, respectively, for a memory cell 105 employing a ferroelectric capacitor 220 as described with reference to FIG. 2. Hysteresis plots 300-a and 300-b depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom}-V_{plate}$).

A ferroelectric material is characterized by a spontaneous electric polarization, where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in conventional DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

Hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220. Additionally, it should be understood that the voltages in hysteresis plots 300-a and 300-b represent a voltage difference across the capacitor (e.g., between the terminals of the ferroelectric capacitor 220) and are directional. For example, a positive voltage may be realized by applying a positive voltage to the perspective terminal (e.g., a cell bottom 240) and maintaining the reference terminal (e.g., a cell plate 230) at ground or virtual ground (or approximately zero volts (0V)). In some examples a negative voltage may be applied by maintaining the perspective terminal at ground and applying a positive voltage to the reference terminal (e.g., cell plate 230). In other words, positive voltages may be applied to arrive at a negative voltage difference $V_{cap}$ across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference $V_{cap}$ shown in hysteresis plots 300-a and 300-b.

As depicted in hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, charge state 305-a and charge state 310-b, which may represent a positively saturated polarization state and a negatively saturated polarization state, respectively. Charge states 305-a and 310-a may be at a physical condition illustrating remnant polarization (Pr) values, which may refer to the polarization (or charge) that remains upon removing the external bias (e.g., voltage). The coercive voltage is the voltage at which the charge (or polarization) is zero. According to the example of hysteresis plot 300-a, charge state 305-a may represent a logic 1 when no voltage difference is applied across the ferroelectric capacitor 220, and charge state 310-a may represent a logic 0 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, voltage 315 may be a voltage equal to or greater than a positive saturation voltage, and applying the voltage 315 across the ferroelectric capacitor 220 may result in charge accumulation until charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between charge state 305-b and the charge state 305-a at zero voltage across the capacitor. Similarly, voltage 325 may be a voltage equal to or lesser than a negative saturation voltage, and applying the voltage 325 across the ferroelectric capacitor 220 results in charge accumulation until charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between charge state 310-b and the charge state 310-a at zero voltage across the capacitor. In some examples the voltage 315 and the voltage 325, representing saturation voltages, may have the same magnitude, but opposite polarity.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic capacitance on access lines, and other factors. In other words, the charge state resulting from a read operation may depend on whether charge state 305-a or 310-a was initially stored, among other factors.

Hysteresis plot 300-b illustrates an example of reading of stored charge states 305-a and 310-a. A read voltage 335 may be applied, for example, as a voltage difference via a digit line 210 and a plate line 215 as described with reference to FIG. 2. Hysteresis plot 300-b may illustrate read operations where the read voltage 335 is negative voltage difference $V_{cap}$ (e.g., where $V_{bottom}-V_{plate}$ is negative). A negative read voltage across the capacitor may be referred to as a "plate high" read operation, where a plate line 215 is taken initially to a high voltage, and a digit line 210 is initially at a low voltage (e.g., a ground voltage). Although read voltage 335 is shown as a negative voltage across the ferroelectric capacitor 220, in alternative operations a read voltage may be a positive voltage across the ferroelectric capacitor 220, which may be referred to as a "plate low" read operation.

The read voltage 335 may be applied across the ferroelectric capacitor 220 when a memory cell 105 is selected (e.g., by activating a selection component 250 as described with reference to FIG. 2). Upon applying the read voltage 335 to the ferroelectric capacitor 220, charge may flow into or out of the ferroelectric capacitor 220 via the digit line 210 and plate line 215, and different charge states may result depending on whether the ferroelectric capacitor 220 was at charge state 305-a (e.g., a logic 1) or at charge state 310-a (e.g., a logic 0).

When performing a read operation on a ferroelectric capacitor 220 at the charge state 310-a (e.g., a logic 0), additional negative charge may accumulate across the ferroelectric capacitor 220, and the charge state may follow path 340 until reaching the charge and voltage of charge state 310-c. The amount of charge flowing through the capacitor 220 may be related to the intrinsic capacitance of the digit line 210 (e.g., intrinsic capacitance 260 described with reference to FIG. 2). Accordingly, as shown by the transition between charge state 310-a and charge state 310-c, the resulting voltage difference 350 may be a relatively large negative value due to the relatively large change in voltage for the given change in charge. Thus, upon reading a logic 0 in a "plate high" read operation, the digit line voltage, equal to the sum of $V_{PL}$ and the value of ($V_{bottom}-V_{plate}$) at charge state 310-c, may be a relatively low voltage. Such a read operation may not change the remnant polarization of the ferroelectric capacitor 220 that stored charge state 310-a, and thus after performing the read operation the ferroelectric capacitor 220 may return to charge state 310-a via path 340 when the read voltage 335 is removed (e.g., by applying a zero net voltage across the ferroelectric capacitor 220). Thus, performing a read operation with a negative read voltage on a ferroelectric capacitor 220 with a charge state 305-a may be considered a non-destructive read process.

When performing the read operation on the ferroelectric capacitor 220 at the charge state 305-a (e.g., a logic 1), the stored charge may reverse polarity as a net negative charge accumulates across the ferroelectric capacitor 220, and the charge state may follow path 360 until reaching the charge and voltage of charge state 305-c. The amount of charge flowing through the capacitor 220 may again be related to the intrinsic capacitance of the digit line 210 (e.g., intrinsic capacitance 260 described with reference to FIG. 2). Accordingly, as shown by the transition between charge state 305-a and charge state 305-c, the resulting voltage difference 355 may be a relatively small negative value due to the relatively small change in voltage for the given change in charge. Thus, upon reading a logic 1 in a "plate high" read operation, the digit line voltage, equal to the sum of $V_{PL}$ and the value of ($V_{bottom}-V_{plate}$) at charge state 310-c, may be a relatively high voltage.

In various examples, a read operation with a negative read voltage (e.g., read voltage 335) may result in a reduction or a reversal of remnant polarization of the capacitor 220 that stored charge state 305-a. In other words, according to the properties of the ferroelectric material, after performing the read operation the ferroelectric capacitor 220 may not return to charge state 305-a when the read voltage 335 is removed (e.g., by applying a zero net voltage across the capacitor 220). Rather, when applying a zero net voltage across the ferroelectric capacitor 220 after a read operation with read voltage 335, the charge state may follow path 365 from charge state 305-c to charge state 305-d, illustrating a net reduction in polarization magnitude (i.e., a less positively polarized charge state than initial charge state 305-a). Thus, performing a read operation with a negative read voltage on a ferroelectric capacitor 220 with a charge state 305-a may be a destructive read process. However, in some sensing schemes, a reduced remnant polarization may still be read as the same stored logic state as a saturated remnant polarization state (e.g., supporting detection of a logic 0 from both charge state 305-a and charge state 305-d), thereby providing a degree of non-volatility for a memory cell 105 with respect to read operations.

The transition from charge state 305-a to charge state 305-d may be illustrative of a sensing operation that is associated with a partial reduction and/or partial reversal in polarization of a ferroelectric capacitor 220 of a memory cell (e.g., a reduction in the magnitude of charge Q from charge state 305-a to charge state 305-d). In various examples, the amount of change in polarization of a ferroelectric capacitor 220 of a memory cell 105 as a result of a sensing operation may be selected according to a particular sensing scheme. In some examples sensing operations having a greater change in polarization of a ferroelectric capacitor 220 of a memory cell 105 may be associated with relatively greater robustness in detecting a logic state of a memory cell 105. In some sensing schemes, sensing a logic 1 of a ferroelectric capacitor 220 at a charge state 305-a may result in a full reversal of polarization, with the ferroelectric capacitor 220 transitioning from charge state 305-a to 310-a after the sensing operation. Such sensing schemes may be referred to as a "2Pr" sensing scheme, because the sensing operations may be based on a transition of charge equal to two times the saturation polarization magnitude of a ferroelectric capacitor 220 of the memory cell 105 being sensed.

The position of charge states 305-c and charge state 310-c after initiating a read operation may depend on a number of factors, including the specific sensing scheme and circuitry. In some cases, the final charge may depend on the net capacitance of the digit line 210 coupled with the memory cell 105, which may include an intrinsic capacitance 260, integrator capacitors, and others. For example, if a ferroelectric capacitor 220 is electrically coupled with digit line 210 at 0V and voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 130 may not be equal to the read voltage 335, or the resulting voltages 350 or 355, and instead may depend on the voltage of the digit line 210 following a period of charge sharing. The position of charge states 305-c and 310-c on hysteresis plot 300-b upon initiating a read operation may depend on the net capacitance of the digit line 210 and may be determined through a load-line analysis—i.e., charge states 305-c and 310-c may be defined with respect to the net capacitance of the digit line 210. As a result, the voltage of the ferroelectric capacitor 220 after initiating a read operation (e.g., voltage 350 when reading the ferroelectric capacitor 220 that stored charge state 310-a, or voltage 355 when reading the ferroelectric capacitor 220 that stored charge state 305-a), may be different and may depend on the initial state of the ferroelectric capacitor 220.

The initial state of the ferroelectric capacitor 220 may be determined by comparing the resultant voltage of a digit line 210 (or signal line 280, where applicable) with a reference voltage (e.g., via a reference line 270 as described with reference to FIG. 2). In some examples the digit line voltage may be the sum of the plate line voltage and the final voltage across the ferroelectric capacitor 220 (e.g., voltage 350 when reading the ferroelectric capacitor 220 having a stored charge state 310-a, or voltage 355 when reading the ferroelectric capacitor 220 having a stored charge state 305-a). In some examples the digit line voltage may be the difference between voltage 335 and the final voltage across the capacitor 220 (e.g., (voltage 335-voltage 350) when reading the ferroelectric capacitor 220 having a stored charge state 310-a, or (voltage 335-voltage 355) when reading the ferroelectric capacitor 220 having a stored charge state 305-a).

In some sensing schemes a reference voltage may be generated such that the reference voltage is between the possible resultant voltages when reading different logic states. For example, a reference voltage may be selected to be lower than the resulting digit line voltage when reading a logic 1, and higher than the resulting digit line voltage when reading a logic 0. In other examples a comparison may be made at a portion of a sense component 130 that is different from a portion where a digit line is coupled, and therefore a reference voltage may be selected to be lower than the resulting voltage at the comparison portion of the sense component 130 when reading a logic 1, and higher than the resulting voltage at the comparison portion of the sense component 130 when reading a logic 0. During comparison by the sense component 130, the voltage based on the sensing may be determined to be higher or lower than the reference voltage, and the stored logic state of the memory cell 105 (i.e., a logic 0 or 1) may thus be determined.

During a sensing operation, the resulting signals from reading various memory cells 105 may be a function of manufacturing or operational variations between the various memory cells 105. For example, capacitors of various memory cells 105 may have different levels of capacitance or saturation polarization, so that a logic 0 may be associated with different levels of charge from one memory cell to the next, and a logic 1 may be associated with different levels of charge from one memory cell to the next. Further, intrinsic capacitance (e.g., intrinsic capacitance 260 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 0 may be associated with different levels of digit line voltage from one memory cell to the next (e.g., resulting voltage 350 may vary from reading one memory cell 105 to the next), and reading a logic 1 may be associated with different levels of digit line voltage from one memory cell to the next (e.g., resulting voltage 355 may vary from reading one memory cell 105 to the next).

A reference voltage may be provided between a statistical average of voltages associated with reading a logic 0 and a statistical average of voltages associated with reading a logic 1, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference", and having a low minimum read voltage difference may be associated with difficulties in reliably sensing the logic states of memory cells in a given memory device.

In order to reliably detect the logic state of a plurality of memory cells 105 that are subject to manufacturing and operational variations, a sense component 130 may be designed to detect relatively small differences between a resulting voltage of reading a particular logic state and an associated level of a reference voltage. The measure of how small a voltage difference a sense component 130 can detect and latch may be referred to as a "sense voltage detection threshold," and the difference between the sense voltage detection threshold and the minimum read voltage difference (e.g., (sense voltage detection threshold)−(minimum read voltage difference)) for a memory device may be referred to as the "sense margin" for the memory device. Thus, to improve the reliability reading logic states of the memory cells 105 of a memory device, it may be preferable to have a relatively large (e.g., broad) sense margin, as small (e.g., narrow) sense margins may be associated with incorrectly detecting the logic state of memory cells 105.

The sense voltage detection threshold of a sense component 130 may be based on various characteristics of the components of the sense component 130. For example, in a sense component 130 that employs transistors, such as cross-coupled pairs of transistors, for latching an output voltage based on a detected voltage difference, the sense voltage detection threshold of the sense component 130 may be based at least in part on the activation voltages of the transistors. In order to support a relatively low sense voltage detection threshold, a sense component 130 may employ transistors having a relatively low activation threshold voltage, which may include forming the transistors with relatively thin gate insulation. Additionally or alternatively, the sense voltage detection threshold of the sense component 130 may be based at least in part on how closely matched the activation voltages of transistors are in the sense component 130. Transistors having relatively thin gate insulation may also be associated with a relatively narrow statistical distribution of activation threshold voltages, for example, which may therefore improve the sense margin of the sense component 130. However, transistors having a relatively thin gate insulation may also be associated with relatively low voltage isolation characteristics, and therefore may not support relatively higher voltage signals that may be associated with accessing memory cells 105.

Although described above in the context of transistors, a sense component 130 may include other components, or combinations of components, and components having relatively lower voltage isolation characteristics may be favorable for supporting a relatively small sense voltage detection threshold. Additionally or alternatively, the components having the relatively lower voltage isolation characteristics may be associated with lower power consumption, due to a lower power consumption during operation of the components or a lower power consumption associated with a relatively lower voltage supply. However, the components having the relatively lower voltage isolation characteristics may not be suitable for supporting relatively higher voltage signals that may be associated with accessing memory cells 105.

In some memory devices, voltages associated with access operations of a memory cell 105 may have a greater magnitude than voltages associated with input/output operations. For example, voltage 315 or voltage 325 associated with a FeRAM write process, or voltage 335 associated with a FeRAM read process, may have a higher magnitude than voltages associated with input/output component 140 described with reference to FIG. 1. In order to support the relatively higher voltage magnitudes of accessing FeRAM memory cells 105, a legacy sense component may employ a legacy design (e.g., according to legacy DRAM architectures) with components that are all associated with a relatively high voltage isolation characteristic, despite the lower voltage signals of the input/output operations. However, the legacy design having components that are all associated with the relatively high voltage isolation characteristic may be associated with relatively narrow sense margins.

To more effectively support the relatively the higher voltage access operations and the relatively lower voltage input/output operations, a sense component 130 (e.g., sense components 130 described with reference to FIGS. 1 and 2) may include different portions that selectively employ components having different voltage isolation characteristics. In other words, a sense component 130 may combine components having a relatively high voltage isolation characteristics to support relatively high voltage signals with components having a relatively low voltage isolation characteristics to support relatively broad sense margins or relatively low power consumption.

Figure 4:
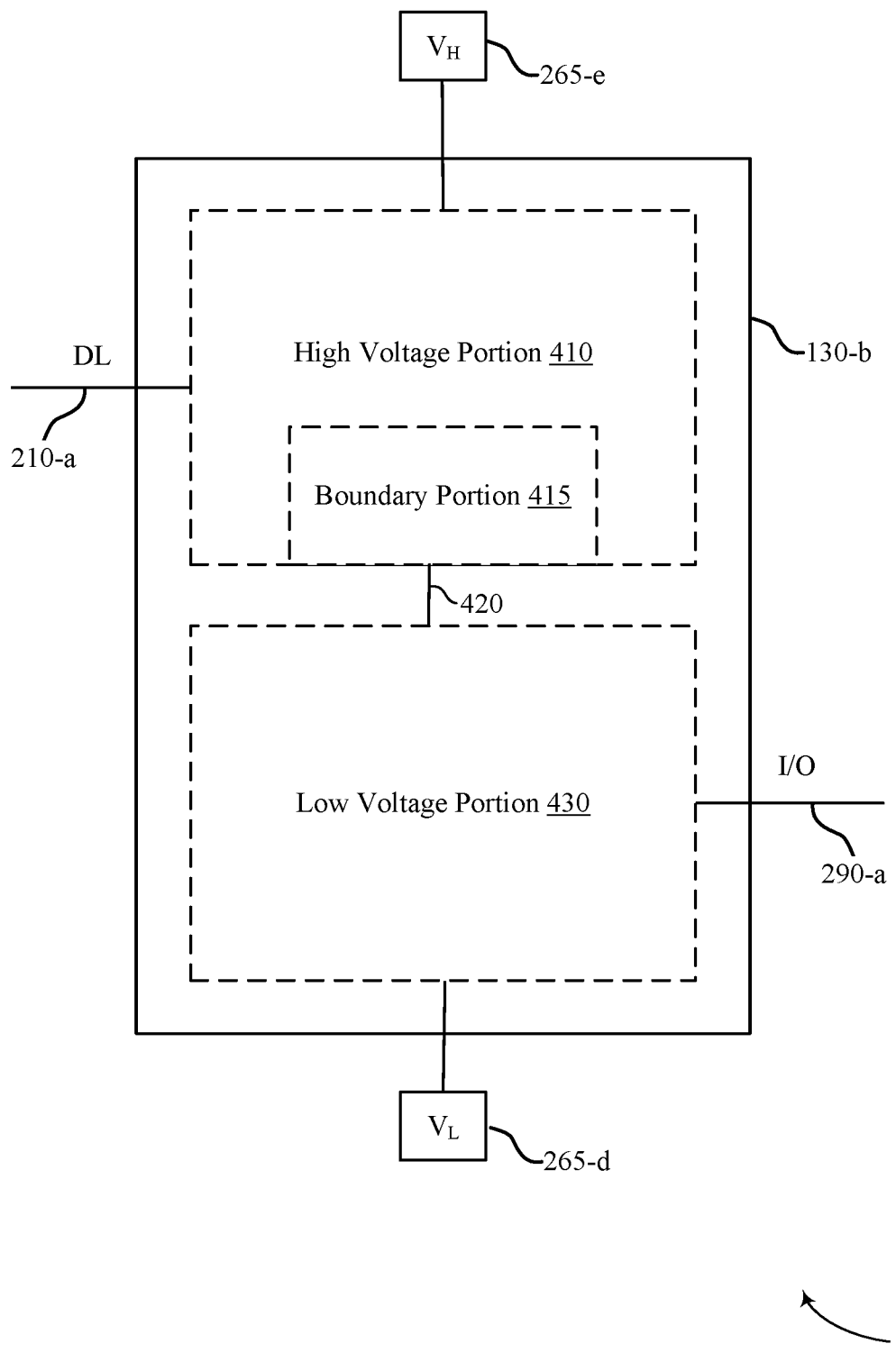
FIG. 4 illustrates an example of a circuit that may support sense amplifier schemes for accessing memory cells in accordance with various embodiments of the present disclosure.

FIG. 4 illustrates an example of a circuit 400 that may support sense amplifier schemes for accessing memory cells in accordance with various embodiments of the present disclosure. The circuit 400 includes a sense component 130-b for sensing a logic state of a memory cell 105 (not shown). Electrical signals may be communicated between the sense component 130-b and the memory cell 105 via a digit line 210-a, which may be referred to as an access line of the memory cell 105. Although only the single digit line 210-a is shown, various other examples of a sense component 130 may include two or more digit lines 210, which may be used to connect two or more memory cells 105 with the sense component 130. Electrical signals may be communicated between the sense component 130-b and an input output component 140 (not shown) via an input/output (I/O) line 290-a. The memory cell 105 may be associated with access operations having a higher voltage than input/output operations, such as those of a memory device having an FeRAM memory cell 105 that employs legacy DRAM input/output architectures.

The sense component 130-b may include a high voltage portion 410 and a low voltage portion 430. The high voltage portion 410 may be coupled between the memory cell 105 and the low voltage portion 430, and the low voltage portion 430 may be coupled between the input/output component 140 and the high voltage portion 410 (although the order of these portions between a memory cell 105 and an input/output component 140 may be reversed when access operations are associated with lower voltages than input/output operations, or for other reasons). The high voltage portion 410 may be coupled with the low voltage portion 430 by an intermediate line 420. Although the sense component 130-b is shown with a single intermediate line 420, other sense components 130 in accordance with the present disclosure may have any number of intermediate lines 420, including more than one intermediate line 420. In some examples the intermediate line 420 may be coupled with a boundary portion 415 (e.g., of the high voltage portion 410). Various examples may also include a reference line 270 (not shown) coupled with the sense component 130-b, and a reference line 270 may be coupled with the high voltage portion 410 or the low voltage portion 430 of a sense component 130.

The sense component may include, or otherwise be provided a high sense component source voltage and a low sense component source voltage. For example, the sense component may be coupled with a high sense component voltage source 265-e, having a relatively high voltage level $V_H$. The voltage level $V_H$ may be associated with the relatively higher voltage magnitude operations for accessing a memory cell 105, such as an FeRAM memory cell 105 (e.g., voltage 315, voltage 325, or voltage 335 described with reference to FIG. 3). In some examples, $V_H$ may be referred to as VARY, and may have a voltage of approximately 1.6V. The first voltage isolation characteristic of the high voltage portion 410 may be selected in a manner that supports electrical isolation at the voltage level $V_H$. The sense component may also be coupled with a low sense component voltage source 265-d, having a relatively low voltage level $V_L$.

The voltage level $V_L$ may be associated with the relatively lower voltage input/output operations for accessing a memory cell 105, such input/output operations according to legacy DRAM architectures. In some examples, $V_L$ may be a ground or virtual ground voltage (e.g., 0V). The second voltage isolation characteristic of the low voltage portion 430 may be selected in a manner that supports electrical isolation at the voltage level $V_L$, or some other intermediate voltage between $V_H$ and $V_L$, such as 1V in some examples, but may not support electrical isolation at the relatively higher voltage level $V_H$. In some examples a sense component 130 may be coupled with other voltage sources 265 (not shown), which may be coupled with one or more of the high voltage portion 410, the boundary portion 415, or the low voltage portion 430. Although voltage sources 265-d and 265-e are shown outside the sense component 130-b, voltage sources 265 may alternatively or equivalently be within a sense component 130.

The high voltage portion 410 may include components (e.g., transistors, amplifiers, switching components, selection components, or conductors) having relatively a higher voltage isolation characteristic, and the low voltage portion 430 may include components having a relatively lower voltage isolation characteristic. For example, the high voltage portion 410 may include a first set of transistors, where each transistor of the first set of transistors has the first voltage isolation characteristic, and the low voltage portion 430 may include a second set of transistors, where each transistor of the second set of transistors has the second voltage isolation characteristic that is different from the first voltage isolation characteristic. The boundary portion 415 may include one or more components (e.g., transistors, amplifiers, switching components, selection components, or conductors) having the first voltage isolation characteristic, such that the high voltage portion 410 of the sense component 130-b is coupled with the low voltage portion 430 of the sense component 130-b (e.g., via intermediate line(s) 420) via at least one component having the first voltage isolation characteristic.

For example, the high voltage portion 410 may be coupled with the low voltage portion 430 via at least one transistor (e.g., of the boundary portion 415) having the first voltage isolation characteristic, and the at least one transistor may be operating as a switching component (e.g., with a logical signal provided to the gate of the transistor to selectively conduct through, or isolate across the transistor), a clamping component (e.g., by a pair of transistors in a clamping configuration, which may be coupled with a clamping voltage source), or by way of other functions of the at least one transistor. In examples where a component of the boundary portion 415 is acting as a switching component, the switching component may be deactivated while signals of the high voltage portion 410 are relatively high, and activated while signals of the high voltage portion 410 are relatively low (e.g., within operating conditions associated with the second voltage isolation characteristic), thereby isolating the low voltage portion 430 from relatively high voltage signals. In various embodiments in accordance with the present disclosure, the relatively lower voltage signals of the low voltage portion 430 may be based at least in part on the relatively higher voltage signals of the high voltage portion 410, the relatively higher voltage signals of the high voltage portion

410 may be based at least in part on the relatively lower voltage signals of the low voltage portion 430, or both.

In various examples of the sense component 130-*b*, the described voltage isolation characteristic may refer to one or more properties, or combinations of properties, of the components of the high voltage portion 410 and the low voltage portion 430. For example, the first voltage isolation characteristic may be a first isolation voltage, and the second voltage isolation characteristic may be a second isolation voltage that is less than the first isolation voltage. In another example, the first voltage isolation characteristic may be a first activation threshold voltage (e.g., a threshold voltage of one or more transistors), and the second voltage isolation characteristic may be a second activation threshold voltage that is less than the first activation threshold voltage.

In another example, the first voltage isolation characteristic may be a first degree of insulation between a transistor gate and a transistor body, and the second voltage isolation characteristic may be a second degree of insulation between the transistor gate and the transistor body that is less than the first degree of insulation between the transistor gate and the transistor body. In another example, the first voltage isolation characteristic may be a first degree of insulation between the source and drain of associated transistors, and the second voltage isolation characteristic may be a second degree of insulation between the source and drain of associated transistors that is less than the first degree of insulation between the source and drain of associated transistors.

In some examples, the first voltage isolation characteristic may be based at least in part a first gate insulation thickness, and the second voltage isolation characteristic may be based at least in part a second gate insulation thickness that is less than the first gate insulation thickness. Other examples of voltage isolation characteristics applicable to the described portions of a sense component 130 would be apparent in view of the present disclosure. Further, the described voltage isolation characteristics may refer to a nominal characteristic or a threshold characteristic (e.g., an upper threshold or a lower threshold), and may also include or otherwise account for variations due to manufacturing tolerances, operational tolerances, or any other sources of variation from the nominal or threshold voltage isolation characteristic.

By employing components having different voltage isolation characteristics in different portions, the sense component 130-*b* may more effectively balance performance tradeoffs associated with a memory device. For example, components having a relatively high voltage isolation characteristic may support operations requiring relatively high voltage signals, such as access operations associated with FeRAM memory architectures. However, components having the relatively high voltage isolation characteristic may also be associated with relatively poor manufacturing or operational tolerances, which may result in a greater distribution of signals from sensing various memory cells 105. Thus, components having the relatively high voltage isolation characteristic may also be associated with relatively high uncertainty in sensing operations due to the manufacturing or operational tolerances (e.g., relatively narrow sense margins). Additionally or alternatively, components having the relatively high voltage isolation characteristic may also be associated with relatively high power consumption to support accessing memory cells 105. Thus, components having the relatively high voltage isolation characteristic may also be associated with poor operational efficiency.

The sense component 130-*b* may provide greater design flexibility by selectively employing components having relatively high voltage isolation characteristics in a portion of the sense component 130-*b* having relatively higher voltage signals, and components having relatively low voltage isolation characteristics in a portion of the sense component 130-*b* having relatively lower voltage signals. The components having relatively low voltage isolation characteristics may be associated with a relatively favorable manufacturing or operational tolerances, so that selectively employing the components having relatively low voltage isolation characteristics may improve the sense margins associated with the sense component 130-*b* as compared with a sense component that employs only components having the relatively high voltage isolation characteristics.

In one example, transistors having a relatively thicker gate insulation thickness may support a relatively higher voltage isolation of 1.6V, and may be associated with a relatively greater 3-sigma statistical distribution of activation voltage of 100 mV. Transistors having a relatively thinner gate insulation thickness may support a relatively lower voltage isolation of 1.0V, and may be associated with a relatively narrower 3-sigma statistical variation of activation voltage of only 40-50 mV. Thus, transistors having the relatively thinner gate insulation thickness may be beneficially employed in the low voltage portion 430 in order to improve sense margins of the sense component 130-*b* by employing transistors that have activation voltages that are more likely to be matched to each other.

Although only high voltage portion 410 and low voltage portion 430 are shown in the example of sense component 130-*b*, various other examples of a sense component 130 may include more than two portions. For example, a sense component in accordance with the present disclosure may also include an intermediate portion, where components of the intermediate portion have an intermediate voltage isolation characteristic that is between a relatively high voltage isolation characteristic and a relatively low voltage isolation characteristic. In other words, a sense component 130 in accordance with the present disclosure may have two or more portions that selectively employ components having a respective voltage isolation characteristic to favorably improve sense margins, power consumption, or other operational characteristics.

Figure 5:
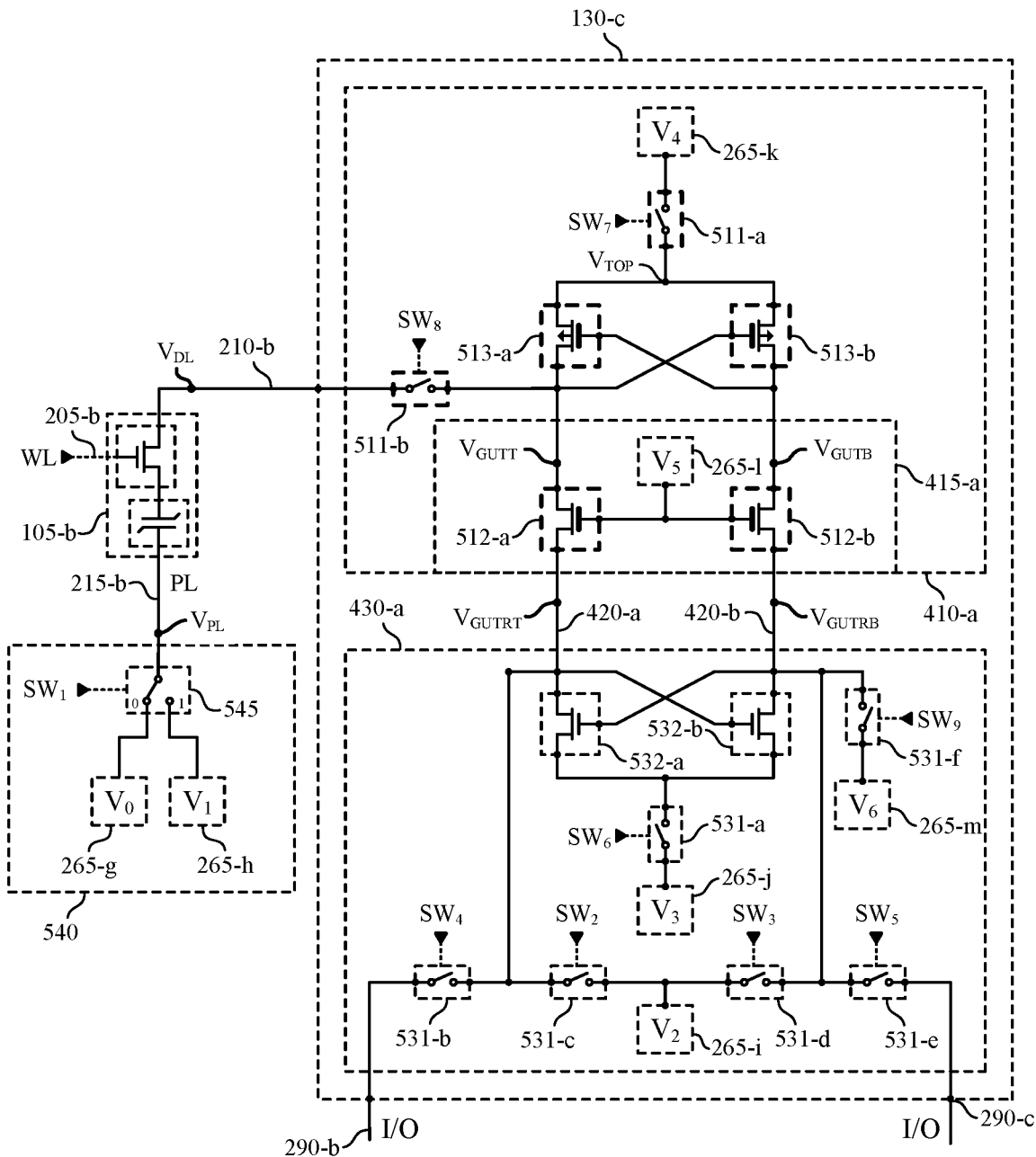
FIG. 5 illustrates an example of a circuit that may support sense amplifier schemes for accessing memory cells in accordance with various embodiments of the present disclosure.

FIG. 5 illustrates an example of a circuit 500 that may support sense amplifier schemes for accessing memory cells in accordance with various embodiments of the present disclosure. The circuit 500 includes a sense component 130-*c* for sensing a logic state of a memory cell 105-*b*. The memory cell 105-*b* may be selected by a logical signal WL via word line 205-*b*. Electrical signals may be communicated between the sense component 130-*c* and the memory cell 105-*b* via a digit line 210-*b*, which may be referred to as an access line of the memory cell 105-*b*, and may have a voltage $V_{DL}$ as shown. Electrical signals may be communicated between the sense component 130-*c* and an input output component 140 (not shown) via input/output lines 290-*b* and 290-*c*. The memory cell 105-*b* may be associated with access operations having a higher voltage magnitude than input/output operations, such as those associated with a device that accesses an FeRAM memory cell 105 and employs a legacy DRAM input/output architecture.

The sense component 130-*c* may include a high voltage portion 410-*a* and a low voltage portion 430-*a*. The high voltage portion 410-*a* may be coupled between the memory cell 105-*b* and the low voltage portion 430-*a*, and the low voltage portion 430-*a* may be coupled between the input/output component 140 and the high voltage portion 410-*a*. The high voltage portion 410-*a* may be coupled with the low voltage portion 430-*a* by intermediate lines 420-*a* and 420-b. The intermediate lines 420-a and 420-b may be coupled with a boundary portion 415-a (e.g., of the high voltage portion 410-a). The high voltage portion 410-a may include components having a relatively higher voltage isolation characteristic, and the low voltage portion 430-a may include components having a relatively lower voltage isolation characteristic.

The circuit 500 may also include a variety of voltage sources 265, which may be coupled with various voltage supplies and/or common grounding or virtual grounding points of a memory device that includes the example circuit 500. For example, a variable voltage source 540 may represent a plate line voltage source, and may be coupled with the memory cell 105-b via a plate line 215-b having a voltage $V_{PL}$ as shown. The variable voltage source 540 may be used for read or write operations, including those operations described with reference to hysteresis plots 300-a or 300-b of FIG. 3 (e.g., supporting applying $V_{cap}$ equal to voltage 315, voltage 325, or voltage 335 described with reference to FIG. 3). In the example of circuit 500, the variable voltage source 540 may include a voltage source 265-g having a voltage $V_0$ and a voltage source 265-h having a voltage $V_1$, which may be selected for connection with the memory cell 105-b by a voltage switching component 545 by way of a logical signal $SW_1$. In some examples the voltage source 265-g may be coupled with a common grounding point (not shown), having a voltage level of 0V. Voltage source 265-h may be coupled with a voltage supply having a relatively higher voltage (e.g., 1.6V, which may be referred to as VARY) than that of voltage source 265-g, for supporting voltages across the memory cell 105-b for access operations. Although the variable voltage source 540 is illustrated as including two voltage sources 265 and a voltage switching component 545, a variable voltage source 540 supporting the operations herein may include other configurations, such as a voltage buffer or an otherwise selectable voltage that provides a variable voltage to the plate line 215-b.

The high voltage portion 410-a may be coupled with the digit line 210-b via a switching component 511-b having the relatively higher voltage isolation characteristic, and the switching component 511-b may be activated or deactivated by a logical signal $SW_8$. The high voltage portion 410-a may also include a pair of cross-coupled p-type transistors 513-a and 513-b, each having the relatively higher voltage isolation characteristic. For example, the pair of cross-coupled p-type transistors 513-a and 513-b may have a relatively high gate insulation thickness. The cross-coupled p-type transistors 513-a and 513-b may be coupled with a voltage source 265-k via a switching component 511-a having the relatively higher voltage isolation characteristic, and the switching component 511-a may be activated or deactivated by a logical signal $SW_7$. The voltage source 265-k may have a voltage $V_4$, which may represent a high sense component source voltage of the sense component 130-c. In some examples the voltage level $V_4$ may be the same as the voltage level $V_1$, which may support reading and writing operations of the memory cell 105-b at the same magnitude but opposite polarities (e.g., as defined across the memory cell 105-b).

The boundary portion 415-a may include a pair of n-type transistors 512-a and 512-b, each having the relatively higher voltage characteristic, and configured in a clamping configuration. For example, the gate terminals of each of the n-type transistors 512-a and 512-b may be coupled with a voltage source 265-l having a voltage $V_5$, which in some examples may be a variable voltage source (e.g., providing different voltages, or supporting a voltage being enabled and disabled or grounded). The voltage $V_5$ may be selected such that signals passing from the high voltage portion 410-a to the low voltage portion 430-a via the boundary portion 415-a are limited based at least in part on the voltage level $V_5$ (e.g., limited to a level of $V_5-V_{th,clamp}$, where $V_{th,clamp}$ is equal to the activation threshold voltage of the n-type transistors 512-a or 512-b). The signals supported by the boundary portion 415-a may be described with reference to voltages $V_{GUTT}$, $V_{GUTB}$, $V_{GUTRT}$, and $V_{GUTRB}$ at the locations shown. The pair of cross-coupled n-type transistors 512-a and 512-b may have a relatively high gate insulation thickness, which may be substantially (e.g., nominally) the same gate insulation thickness, or at least as thick as a minimum gate insulation thickness as the pair of cross-coupled p-type transistors 513-a and 513-b.

The low voltage portion 430-a may be coupled with the input/output line 290-c via switching component 531-b having the relatively lower voltage isolation characteristic, and the switching component 531-b may be activated or deactivated by a logical signal $SW_4$. The low voltage portion 430-a may be coupled with the input/output line 290-c via switching component 531-e having the relatively lower voltage isolation characteristic, and the switching component 531-e may be activated or deactivated by a logical signal $SW_5$. In some examples, the logical signals $SW_4$ and $SW_5$ may be fed by a common source, such that switching components 531-b and 531-e are activated at the same times, and deactivated at the same times. The low voltage portion 430-a may also include a pair of cross-coupled n-type transistors 532-a and 532-b, each having the relatively lower voltage isolation characteristic. For example, the pair of cross-coupled n-type transistors 532-a and 532-b may have a relatively low gate insulation thickness. The cross-coupled n-type transistors 532-a and 532-b may be coupled with a voltage source 265-j via a switching component 531-a having the relatively lower voltage isolation characteristic, and the switching component 531-a may be activated or deactivated by a logical signal $SW_6$. The voltage source 265-j may have a voltage $V_3$, which may represent a low sense component source voltage of the sense component 130-c (e.g., 0V). In some examples the voltage source 265-j may be coupled with a common ground or virtual ground (e.g., the same common ground or virtual ground as is coupled with the voltage source 265-g).

The low voltage portion 430-a may also include a voltage source 265-i having a voltage $V_2$, which in some examples may also be coupled with a common ground or virtual ground (e.g., the same common ground or virtual ground as is coupled with the voltage source 265-g or voltage source 265-j). The voltage source 265-i may be coupled with the pair of cross coupled n-type transistors 532-a and 532-b as shown, via a switching component 531-c and a switching component 531-d, which may each have the relatively lower voltage characteristic. The switching component 531-c may be activated or deactivated by a logical signal $SW_2$ and the switching component 531-d may be activated or deactivated by a logical signal $SW_3$. In some examples the logical signals $SW_2$ and $SW_3$ may be fed by a common source, such that switching components 531-c and 531-d are activated at the same times, and deactivated at the same times.

The low voltage portion 430-a may also include a voltage source 265-m having a voltage $V_6$, which in some examples may be coupled with a reference voltage source. For example, the voltage source 265-m may be coupled with a reference voltage supply outside the sense component 130-c via a reference line 270 (not shown), which may be an example of a reference line 270 coupled with the sense component 130-*c* at the low voltage portion 430-*a*. The voltage source 265-*m* may be coupled with the pair of cross coupled n-type transistors 532-*a* and 532-*b* as shown via a switching component 531-*f*, which may have the relatively lower voltage characteristic. The switching component 531-*f* may be activated or deactivated by a logical signal $SW_9$.

In various examples, the switching components 511 illustrated in the high voltage portion 410-*a* may be transistors, and the respective logical signals may be supplied to the gate terminal of the respective transistor. In such examples, the transistors of the switching components 511 may have substantially the same voltage isolation characteristics as the n-type transistors 512-*a* and 512-*b*, or the p-type transistors 513-*a* and 513-*b*. For example, the gate insulation thickness of the transistors of switching components 511 may be substantially the same as, or at least as thick as a minimum thickness of the relatively high gate insulation thickness of the n-type transistors 512 or the p-type transistors 513.

Additionally or alternatively, the switching components 531 illustrated in the low voltage portion 430-*a* may be transistors, and the respective logical signals may be supplied to the gate terminal of the respective transistor. In such examples, the transistors of the switching components 531 may have substantially the same voltage isolation characteristics as the n-type transistors 532-*a* and 532-*b*. For example, the gate insulation thickness of the transistors of switching components 531 may be substantially the same as, or at least as thick as the minimum thickness of the relatively low gate insulation thickness of the n-type transistors 532, which may be less than the relatively high gate insulation thickness of the n-type transistors 512 or the p-type transistors 513.

Each of the logical signals (e.g., $SW_1$ through $SW_9$ and WL) illustrated in circuit 500 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In some examples, logical signal voltages may be selected based at least in part on a voltage level that is supported by the voltage isolation characteristic associated with the portion of the sense component 130 where the respective logical signal is carried. For example, components of the high voltage portion 410-*a* may be associated with relatively higher voltage logical signals, and components of the low voltage portion 430-*a* may be associated with relatively lower voltage logical signals. In one example, the activated state of logical signal WL may be approximately 3.2V, the activated state of signal $SW_7$ may be approximately 1.6V, and the activated state of signals $SW_2$, $SW_3$, $SW_4$, $SW_5$, $SW_6$, and $SW_9$ may be approximately 1.0V. In some examples the activated state of logical signal $SW_8$ may be in a range of 3.2-3.8V, which in some examples may be higher than supported by the relatively higher voltage isolation characteristic associated with the high voltage portion 410-*a*, so in some examples the switching component 511-*b* may be outside the high voltage portion 410-*a*.

In various examples, voltage sources 265 may be coupled with different configurations of voltage supplies and/or common grounding or virtual grounding points of a memory device that includes the example circuit 500. In some examples, certain voltage sources 265 may be coupled with the same ground point or virtual ground point, and may provide substantially the same reference voltage for various operations of accessing the memory cell 105-*b*. Although voltage sources 265 may be coupled with common voltage supplies and/or grounding points, the voltage of each of the voltage sources 265 coupled with a common voltage supply or common grounding point may be different due to various differences in the circuit 500 (e.g., conductor length, width, resistance, or capacitance) between the respective voltage sources 265 and the associated common voltage supply or common grounding point.

In some examples the voltage sources 265-*j* and 265-*l* may be selected according to particular input/output parameters. For example, voltage sources 265-*j* and 265-*l* may be substantially at 0V and $(1V+V_{th})$, respectively, where $V_{th}$ is the threshold voltages of the pair of n-type transistors 512-*a* and 512-*b* in the clamping configuration, to support a 0V-1V voltage range of input/output lines 290-*c* and 290-*c* in accordance with certain input/output component conventions such as certain legacy DRAM architectures. Voltage sources 265-*h* and 265-*k* may be selected according to particular accessing parameters. For example, voltage sources 265-*h* and 265-*k* may be selected to support reading and writing signals associated with the memory cell 105-*b*, such as voltages 315, 325, or 335 described with reference to FIG. 3, and may each be approximately 1.6V, for example. Thus, in some examples the voltage source 265-*h* and the voltage source 265-*k* may be coupled with the same voltage supply.

Voltage source 265-*m* may provide a reference voltage for sensing the logic state of the memory cell 105-*b*, such that $V_6$ is an average voltage between the voltage of intermediate line 420-*a* (e.g., $V_{GUTRT}$) associated with sensing a logic 1 and a logic 0. In some examples, a voltage of $V_6$ may be provided as a voltage dropped from a voltage supply of the memory device, which may be the same voltage supply coupled with other voltage sources 265. For example, $V_6$ may be provided by connecting voltage source 265-*m* with a same voltage supply as voltage source 265-*h* or voltage source 265-*k*, but with an intervening electrical load (e.g., a resistive load or capacitance) between the voltage supply and the voltage source 265-*m*).

Figure 6:
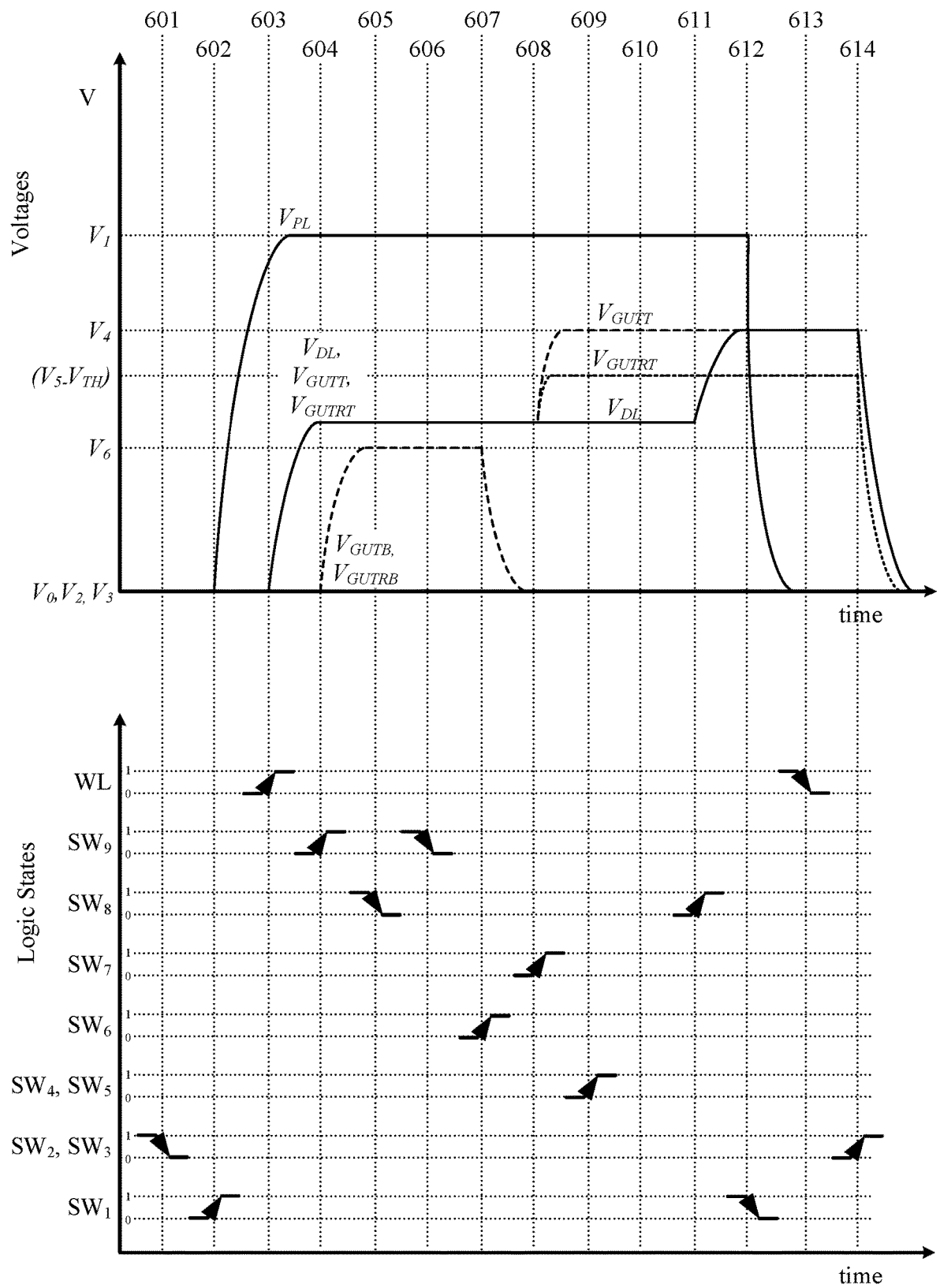
FIG. 6 shows a timing diagram illustrating operations of an example access procedure that may support sense amplifier schemes for accessing memory cells in accordance with various embodiments of the present disclosure.

FIG. 6 shows a timing diagram 600 illustrating operations of an example access procedure that may support sense amplifier schemes for accessing memory cells in accordance with various embodiments of the present disclosure. The example access procedure is described with reference to components of the example circuit 500 of FIG. 5.

In the example of timing diagram 600, memory cell 105-*b* initially stores a logic 1 state as described herein (e.g., with reference to FIG. 3). Further, voltage sources 265-*g*, 265-*i*, and 265-*j* are considered to be grounded, and therefore at a zero voltage (e.g., $V_0$=0V, $V_2$=0V, and $V_3$=0V). However, in other examples voltage sources 265-*g*, 265-*i*, and 265-*j* may be at non-zero voltages, and the voltages of timing diagram 600 may thus be adjusted accordingly. In some examples, prior to initiating the operations of timing diagram 600, the digit line 210-*b* and the plate line 215-*b* may be controlled to the same voltage, which may minimize charge leakage across the memory cell 105-*c*. For example, according to the timing diagram 600, the digit line 210-*b* has an initial voltage of 0V, which may be the same as the initial voltage of the plate line 215-*b*. In other examples, the digit line 210-*b* and the plate line 215-*b* may have some other initial voltage different from the ground voltage. The voltage represented by $V_{TOP}$ may have an initial voltage related to a precharge operation, which may, in some cases, be 0V.

In the example of timing diagram 600, voltage level $V_5$ is selected such that the pair of n-type transistors 512-*a* and 512-*b* are activated until the voltage of the boundary portion 415-*a* (e.g., $V_{GUTT}$ or $V_{GUTB}$, as identified in FIG. 5) reaches a threshold associated with the voltage isolation characteristic of the low voltage portion 430-*a*. Thus, until such a threshold is reached, $V_{DL}$, $V_{GUTT}$, and $V_{GUTRT}$ are substantially equal, and $V_{GUTB}$ and $V_{GUTRB}$ are substantially equal. $V_5$ may be selected to selectively isolate the low voltage portion 430-*a* from the relatively high voltage signals of the high voltage portion 410-*a*, permitting the sense component 130-*c* to employ components having a relatively low voltage isolation characteristic in the low voltage portion 430-*a*.

In some examples the voltage $V_5$ may be selected according to voltages associated with input/output operations. For example, when employing certain legacy DRAM input/output architectures associated with a 0V-1V signal range, $V_5$ may be selected according to the threshold voltage of clamping arrangement, such as the pair of n-type transistors 512-*a* and 512-*b*, to support a 1V output voltage. In one example, the nominal activation for the n-type transistors 512-*a* and 512-*b* is equal to 0.15V, and $V_5$ may be selected to be equal to 1.15V.

At 601, the access procedure may include isolating the sense component 130-*c* from a ground voltage. For example, at 601 the access procedure may include deactivating switching components 531-*c* and 531-*d* (e.g., by deactivating logical signals $SW_2$ and $SW_3$, which may be provided by a common logical signal). Deactivating switching components 531-*c* and 531-*d* may isolate the low voltage portion 430-*a* from voltage source 265-*i* (e.g., floating the associated conductors of the low voltage portion 430-*a*), which may support the development of signals described herein. In some examples the access procedure may also include deactivating switching component 531-*a* (e.g., by deactivating logical signal $SW_6$) to also isolate the voltage source 265-*j* from the low voltage portion 430-*a*.

At 602, the access procedure may include raising the cell plate voltage of the memory cell 105-*b*. For example, at 602 the access procedure may include activating the voltage switching component 545 (e.g., by activating logical signal $SW_1$). Activating voltage switching component 545 may cause a transition from the voltage source 265-*g* being coupled with the plate line 215-*b* to the voltage source 265-*h* being coupled with the plate line 215-*b*. Thus, after activating the voltage switching component 545, plate line voltage $V_{PL}$ may rise from $V_0$ to $V_1$.

At 603, the access procedure may include selecting the memory cell 105-*b* (e.g., by activating a word line via logical signal WL). Selecting the memory cell 105-*b* may cause a capacitor of the memory cell 105-*b* to be coupled with the digit line 210-*b*. Accordingly, the voltage applied across the capacitor of the memory cell 105-*b* (e.g., $V_{cap}$ described with reference to FIG. 3) may initially be equal to $(V_{DL}-V_{PL})$, a negative $V_{cap}$, and charge may be shared between the memory cell 105-*c*, the digit line 210-*b*, and any intrinsic capacitance of the digit line, which may depend on the logic state (e.g., the charge and/or polarization) stored in the memory cell 105-*b*. Charge may be accordingly shared until reaching an equilibrium digit line voltage $V_{DL}$ for the given plate line voltage $V_{PL}=V_1$, the charge state of the memory cell 105-*b*, and the intrinsic capacitance of the digit line 210-*b*.

For example, when the memory cell 105-*b* stores a logic 1, the capacitor of the memory cell 105-*b* may store a positive charge by way of a positive polarization (e.g., a charge state 305-*a* as described with reference to FIG. 3). Thus, when memory cell 105-*b* storing a logic 1 is selected, the memory cell 105-*b* may support a relatively large amount of charge flowing from the memory cell 105-*b* to the digit line 210-*b* with a relatively small change in capacitor voltage $V_{cap}$. Accordingly, the resulting digit line voltage $V_{DL}$ may be relatively high (e.g., higher than a reference voltage) when accessing the memory cell 105-*b* when the memory cell 105-*b* initially stores a logic 1. The clamping voltage $V_5$ may be selected such that the pair of n-type transistors 512-*a* and 512-*b* remain conductive during these operations, such that, following the selection of the memory cell 105-*b*, $V_{GUTT}$ and $V_{GUTRT}$ may also rise to the same level as digit line voltage $V_{DL}$. In some examples, the majority of charge flow may pass through the n-type transistor 512-*a*, rather than the p-type transistor 513-*a* (e.g., because the p-type transistor 513-*a* may be in a state, such as a deactivated state). Thus, the voltage represented by $V_{TOP}$ may remain at substantially a pre-charged level (e.g., a ground or virtual ground voltage level of 0V) in response to the operations of 603.

At 604, the access procedure may include generating a reference voltage at the sense component 130-*c*. For example, at 604 the access procedure may include activating the switching component 531-*f* (e.g., by activating logical signal $SW_9$), coupling the voltage source 265-*m* with the cross-coupled pair of n-type transistors 532-*a* and 532-*b*. Activating switching component 531-*f* may cause the voltage $V_{GUTRB}$ to rise from an initial voltage (e.g., 0V) to the voltage level $V_6$. In the example of accessing the memory cell 105-*b* initially storing a logic 1 state, generating the reference voltage at the sense component 130-*c* results in the voltage $V_{GUTRB}$ being less than the voltage $V_{GUTRT}$.

At 605, the access procedure may include isolating the sense component 130-*c* from the digit line. For example, at 605 the access procedure may include deactivating the switching component 511-*b* (e.g., by deactivating logical signal $SW_8$). Deactivating switching component 511-*b* may cause the voltage $V_{GUTT}$ to be held at the level associated with reading the memory cell 105-*b* (e.g., reading the logic 1 state of the memory cell 105-*b*).

At 606, the access procedure may include isolating the reference voltage from the sense component 130-*c*. For example, at 606 the access procedure may include deactivating the switching component 531-*f* (e.g., by deactivating logical signal $SW_9$). In some examples, deactivating switching component 531-*f* may cause the voltage $V_{GUTRB}$ to be held at the same value (e.g., $V_6$).

At 607, the access procedure may include enabling the pair of n-type transistors 532-*a* and 532-*b* of the low voltage portion 430-*a*, which may be referred to as turning on the n-sense portion of the sense component 130-*c*. For example, at 607 the access procedure may include activating the switching component 531-*a* (e.g., by activating logical signal $SW_6$), coupling the pair of n-type transistors 532-*a* and 532-*b* with the voltage source 265-*j*. In the example of accessing the memory cell 105-*b* initially storing a logic 1 state, because the voltage $V_{GUTRB}$ is less than the voltage $V_{GUTRT}$ prior to 606, $V_{GUTRB}$ may drop to voltage level $V_3$ (e.g., 0V) upon turning on the n-sense portion of the sense component 130-*c*. For example, when the voltage difference $(V_{GUTRT}-V_3)$ is greater than the activation threshold voltage of the n-type transistor 532-*b*, transistor 532-*b* may be activated, thereby allowing charge to flow from the node of $V_{GUTRB}$ through the n-type transistor 532-*b* such that $V_{GUTRB}$ drops to $V_3$. When $(V_{GUTRB}-V_3)$ is not greater than the activation threshold voltage of the n-type transistor 532-*a*, transistor 532-*a* may be deactivated, such that the voltage of $V_{GUTRT}$ is maintained at the same level (e.g., not dropping to $V_3$). Thus, in order to improve sense margins of the sense component 130-c, it may be advantageous for the n-type transistors 532-a and 532-b to have relatively low activation voltage thresholds in order to respond to relatively small voltage differences between $V_{GUTRB}$ and $V_3$ or $V_{GUTRT}$ and $V_3$ when enabling the pair of n-type transistors 532-a and 532-b at 606. When the clamping voltage source 265-l remains enabled (e.g., supporting conduction across the n-type transistor 512-b), $V_{GUTB}$ may also drop to voltage level $V_3$ upon turning on the n-sense portion of the sense component 130-c.

At 608, the access procedure may include enabling the pair of p-type transistors 513-a and 513-b of the high voltage portion 410-a, which may be referred to as turning on the p-sense portion of the sense component 130-c. For example, at 608 the access procedure may include activating the switching component 511-a (e.g., by activating logical signal $SW_7$), coupling the pair of p-type transistors 513-a and 513-b with the voltage source 265-k. In the example of accessing the memory cell 105-b initially storing a logic 1 state, because the voltage $V_{GUTT}$ is greater than the voltage $V_{GUTB}$ prior to 608, $V_{GUTT}$ may rise to voltage level $V_4$ (e.g., 1.6V) upon activating the p-sense portion of the sense component 130-c. For example, when the voltage difference ($V_{GUTB}$–$V_4$) has a negative magnitude that is greater than the activation threshold voltage of the p-type transistor 513-a, transistor 513-a may be activated (e.g., conductive), thereby allowing charge to flow from voltage source 265-k to the node of $V_{GUTT}$ through the p-type transistor 513-a such that $V_{GUTT}$ rises to $V_4$. When ($V_{GUTT}$–$V_4$) does not have a negative magnitude that is greater than the activation threshold voltage of the p-type transistor 513-b, p-type transistor 513-b may be deactivated (e.g., non-conductive), such that the voltage of $V_{GUTB}$ is maintained at the same level (e.g., holding at $V_3$). Thus, in order to improve sense margins of the sense component 130-c, it may be advantageous for the p-type transistors 513-a and 513-b to have relatively low activation voltage thresholds in order to respond to relatively small voltage differences between $V_{GUTB}$ and V or $V_{GUTT}$ and $V_4$ when enabling the pair of p-type transistors 513-a and 513-b at 608.

However, in some examples it may be less important for the p-type transistors 513-a and 513-b to have low activation threshold voltages (e.g., less important than the n-type transistors 532-a and 532-b having low activation threshold voltages), because in some examples $V_4$ may be selected such that the difference between $V_4$ and $V_{GUTT}$ or $V_{GUTB}$ when sensing logic states of the memory cell 105-b is relatively high (e.g., greater than the difference between $V_3$ and $V_{GUTRT}$ or $V_{GUTRB}$ when sensing the memory cell 105-b). Thus, by isolating components of the low-voltage portion 430-a from relatively higher voltage signals in accordance with the present disclosure, the high voltage portion 410-a may support components operating with relatively higher voltage activation thresholds (e.g., as supported by voltage source 265-k having voltage level $V_4$) while still supporting relatively wide sense margins of the sense component 130-c.

When the clamping voltage source 265-l remains enabled (e.g., supporting conduction across the n-type transistor 512-a), $V_{GUTRT}$ may also rise upon turning on the p-sense portion of the sense component 130-c. However, as shown, $V_{GUTRT}$ may not rise to the same voltage level as $V_{GUTT}$. For example, according to the activation properties of the n-type transistor 512-a, $V_{GUTRT}$ may only rise to a level of ($V_5$–$V_{TH}$), where $V_{TH}$ is the threshold activation voltage of the n-type transistor 512-a. In other words, when $V_{GUTT}$ exceeds ($V_5$–$V_{TH}$), the n-type transistor 512-a may be deactivated such that conduction across the n-type transistor 512-a is no longer supported. Accordingly, the n-type transistor 512-a in the boundary portion 415-a may isolate the low voltage portion 430-a from the relatively higher voltage of $V_{GUTT}$. Thus, the signal associated with $V_{GUTT}$ may be an example of a first sense signal for a first portion (e.g., high voltage portion 410) of the sense component 130-c based at least in part on accessing memory cell 105-b, the first sense signal having a first voltage (e.g., $V_4$). The signal associated with $V_{GUTRT}$ may be an example of a second sense signal for a second portion (e.g., low voltage portion 430) of the sense component 130-c, the second sense signal based at least in part on the first sense signal and having a second voltage (e.g., $V_5$–$V_{TH}$) that is less than the first voltage. The operations of 608 may also be an example of, or otherwise support determining a logic state stored by the memory cell 105-b based at least in part on the second sense signal (e.g., the signal associated with $V_{GUTRT}$).

Further, the described read signals may also be an example of providing a first set of signals via a first portion of a sense component (e.g., the signals associated with the voltage $V_{GUTT}$), the first set of signals being within a first voltage range (e.g., having a voltage range of 0-1.6V) associated with access operations of a set of logic states of a memory cell, and the first portion of the sense component comprising transistors having first voltage isolation characteristic; and providing a second set of signals via a second portion of the sense component (e.g., the signals associated with the voltage $V_{GUTRT}$, carried via the low voltage portion 430), the second set of signals being in a second voltage range (e.g., having a voltage range of 0-1V) associated with communicating the set of logic states of the memory cell with an input/output component 140, the second voltage range being less than the first voltage range, and the second portion of the sense component comprising transistors having a second voltage isolation characteristic that is less than the first voltage isolation characteristic.

At 609, the access procedure may include activating the output of the sense component 130-c. For example, at 609 the access procedure may include activating switching components 531-b and 531-e (e.g., by activating logical signals $SW_4$ and $SW_5$, which may be provided by a common logical signal). Activating switching components 531-b and 531-e may couple the sense component 130-c with an input/output component 140 (not shown), providing $V_{GUTRT}$ (e.g., ($V_5$–$V_{TH}$), or approximately 1V) to the input/output component 140 via input/output line 290-b, and providing voltage $V_{GUTRB}$ (e.g., 0V) to the input/output component 140 via input/output line 290-c. Thus, the operations of 608 may be an example of, or otherwise support determining a logic state stored by the memory cell 105-b based at least in part on the second sense signal (e.g., the signal associated with $V_{GUTRT}$).

At 610, the access procedure may include the input/output component 140 providing an output of reading the memory cell 105-b, which in some examples may be followed by cell restore operations (e.g., the operations of 611 and 612). In some examples, the output of the sense component 130-c may be deactivated shortly after activating the output of the sense component 130-c at 609 based at least in part on a transferring pulse width. For example, logical signals $SW_4$ and $SW_5$ may be activated for a transferring pulse width of 2-3 nanoseconds before being deactivated (not shown).

At 611, the access procedure may include a "low" cell restore operation. For example, at 611 the access procedure may include activating switching component 511-b (e.g., by activating logical signal $SW_8$), which may connect the sense component 130-c with the digit line 210-b. Accordingly, charge may flow to the digit line 210-b as fed by voltage source 265-k, and the digit line voltage $V_{DL}$ may rise to the voltage level $V_4$. The operations of 611 may be an example of generating a refresh signal based at least in part on the first sense signal (e.g., the signal associated with $V_{GUTT}$), the refresh signal having a third voltage (e.g., $V_5-V_{TH}$) that is greater than the second voltage (e.g., $V_4$).

At 612, the access procedure may include a "high" cell restore operation. For example, at 612 the access procedure may include deactivating voltage switching component 545 (e.g., by deactivating logical signal $SW_1$). Deactivating voltage switching component 545 may cause a transition from the voltage source 265-h being coupled with the plate line 215-b to the voltage source 265-g being coupled with the plate line 215-b. Thus, after deactivating the voltage switching component 545, plate line voltage $V_{PL}$ may drop from $V_1$ to $V_0$. Accordingly, the voltage across the capacitor (e.g., $V_{cap}$) may be equal to ($V_4-V_0$), which may re-write the memory cell 105-b to a logic 1.

In some embodiments, write operations for the memory cell 105-b may incorporate some or all of the operations of 611 and 612. For example, an input/output component 140 may provide write signals to the sense component 130-b via input/output lines 290-b and 290-c in order to write a logic state to the memory cell 105-b. To write a logic 1 state, the input/output component 140 may provide a relatively high input/output voltage (e.g., $V_5-V_{TH}$, which may be equal to 1V) to the sense component 130-c via the input/output line 290-b, and provide a relatively low input/output voltage (e.g., $V_3$, which may be equal to 0V) to the sense component 130-c via the input/output line 290-c, which may be substantially the same as voltages associated with reading the logic 1 state. In response to being provided these input/output voltages from the input/output component 140, the sense component 130-c may output a relatively high write voltage (e.g., $V_4$, which may be equal to 1.6V) to the memory cell 105-b via digit line 210-b. In some examples, the write operation may also include providing a relatively low write voltage (e.g., $V_0$, which may be equal to 0V) to the memory cell 105-b via plate line 215-b, such that the voltage difference across the memory cell 105-b is equal to +1.6V. Thus, similar to the refresh operations of 611 and 612, the memory cell may be written with a logic 1 state.

The described write operations may be an example of providing a first set of signals via a first portion of a sense component (e.g., the signals to the memory cell 105-b, carried via the high voltage portion 410), the first set of signals being within a first voltage range (e.g., having a voltage range of 0-1.6V) associated with access operations of a set of logic states of a memory cell, and the first portion of the sense component comprising transistors having first voltage isolation characteristic; and providing a second set of signals via a second portion of the sense component (e.g., the signals from an input/output component 140, carried via the low voltage portion 430), the second set of signals being in a second voltage range (e.g., having a voltage range of 0-1V) associated with communicating the set of logic states of the memory cell with an input/output component, the second voltage range being less than the first voltage range, and the second portion of the sense component comprising transistors having a second voltage isolation characteristic that is less than the first voltage isolation characteristic.

At 613, the access procedure may include isolating the memory cell 105-b from the sense component 130-c. For example, at 613 the access procedure may include deactivating a selection component of the memory cell 105-b by deactivating the logical signal WL.

At 614, the access procedure may include grounding the input/output of the low voltage portion 430-a. For example, the access procedure may include activating the switching components 531-c and 531-d (e.g., by activating logical signals $SW_2$ and $SW_3$). Activating switching components 531-c and 531-d may cause the voltage $V_{GUTRT}$ to drop to the voltage level $V_2$ (e.g., 0V). In examples where the clamping voltage source 265-l remains activated, activating switching components 531-c and 531-d may also cause the voltage $V_{GUTT}$ to drop to the voltage level $V_2$.

Although illustrated as separate operations occurring at different times, certain operations may occur simultaneously, or in a different order. In some examples, various operations may be advantageously initiated simultaneously in order to reduce the amount of time required to sense a logic state of the memory cell 105-b. For example, enabling the variable voltage source 540 at 602 and selecting the memory cell 105-b at 603 may occur in an opposite order, or simultaneously (e.g., when logical signals $SW_1$ and WL are driven simultaneously). Additionally or alternatively, selecting the memory cell 105-b at 603 and activating the reference voltage source 265-m at 604 may occur in opposite order, or simultaneously (e.g., when logical signals WL and $SW_9$ are activated simultaneously). Additionally or alternatively, isolating the sense component 130-c from the digit line 210-b at 605 and deactivating the reference voltage source 265-m at 606 may occur in opposite order, or simultaneously (e.g., when logical signals $SW_8$ and $SW_9$ are deactivated simultaneously).

The order of operations shown in timing diagram 600 is for illustration only, and various other orders and combinations of steps may be performed to support sense amplifier schemes for accessing memory cells in accordance with the present disclosure. Further, the timing of the operations of timing diagram 600 is also for illustration purposes only, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 600 are illustrative of transitions from one state to another, and generally reflect transitions between a disabled or deactivated state (e.g., state "0") and an enabled or activated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a ramping behavior, or time-constant (e.g., logarithmic) behavior over time from one logical state to another. In some examples the transition of a component from one state to another may be based at least in part on characteristics of the associated logical signal, including the voltage level of the logical signal or the transition characteristics of the logical signal itself. Thus, the transitions shown in timing diagram 600 are not necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

Figure 7:
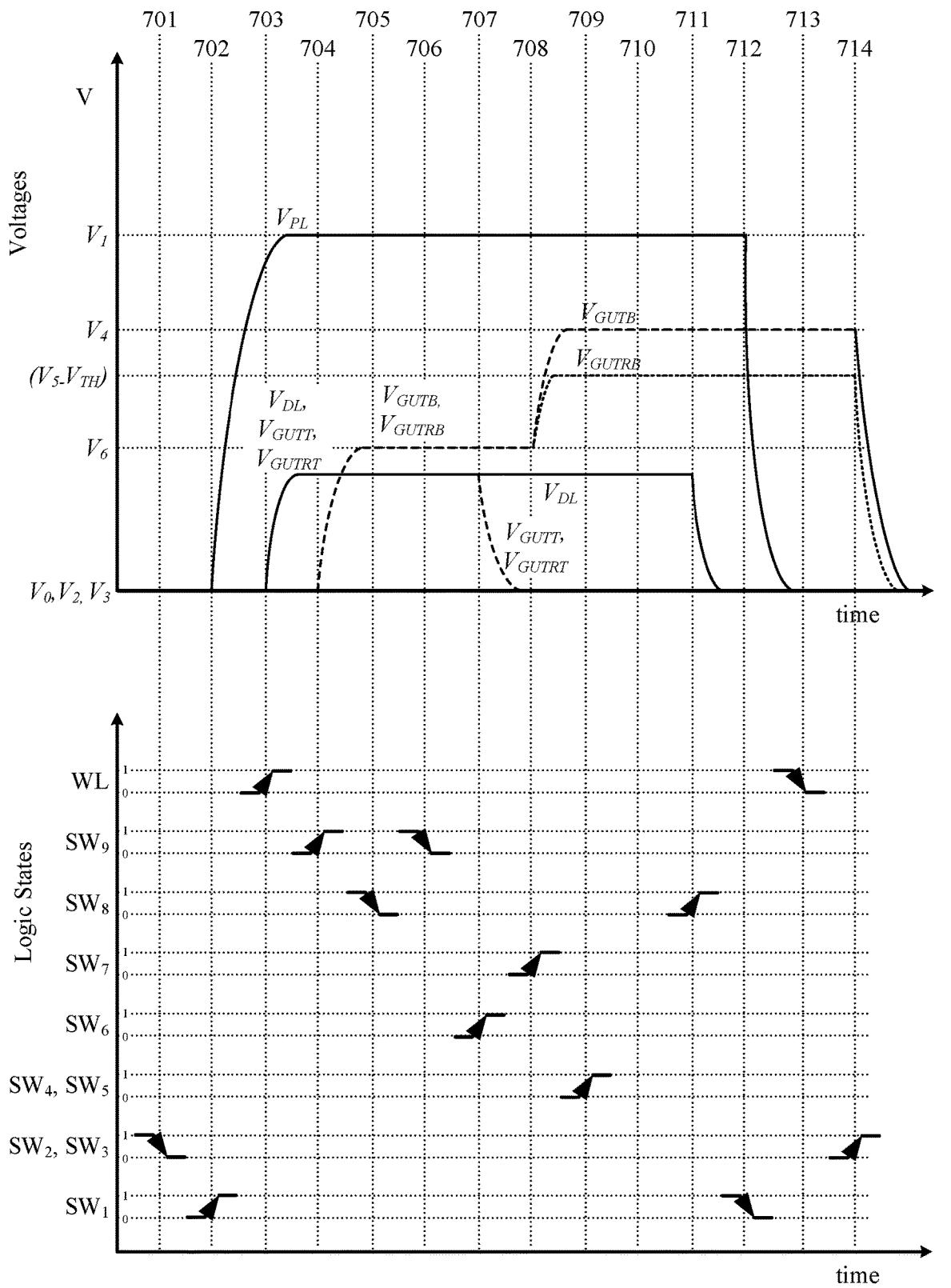
FIG. 7 shows a timing diagram illustrating operations of an example access procedure that may support sense amplifier schemes for accessing memory cells in accordance with various embodiments of the present disclosure.

FIG. 7 shows a timing diagram 700 illustrating operations of an example access procedure that may support sense amplifier schemes for accessing memory cells in accordance with various embodiments of the present disclosure. The example access procedure is described with reference to components of the example circuit 500 of FIG. 5.

In the example of timing diagram 700, memory cell 105-*b* initially stores a logic 0 state as described herein (e.g., with reference to FIG. 3). Further, voltage sources 265-*g*, 265-*i*, and 265-*j* are considered to be grounded, and therefore at a zero voltage (e.g., $V_0=0V$, $V_2=0V$, and $V_3=0V$). However, in other examples voltage sources 265-*g*, 265-*i*, and 265-*j* may be at non-zero voltages, and the voltages of timing diagram 700 may thus be adjusted accordingly. In some examples, prior to initiating the operations of timing diagram 700, the digit line 210-*b* and the plate line 215-*b* may be controlled to the same voltage, which may minimize charge leakage across the memory cell 105-*c*. For example, according to the timing diagram 700, the digit line 210-*b* has an initial voltage of 0V, which may be the same as the initial voltage of the plate line 215-*b*. In other examples, the digit line 210-*b* and the plate line 215-*b* may have some other initial voltage different from the ground voltage. The voltage represented by $V_{TOP}$ may have an initial voltage related to a precharge operation, which may be 0V.

In the example of timing diagram 700, voltage level $V_5$ is selected such that the pair of n-type transistors 512-*a* and 512-*b* are activated until the voltage of the boundary portion 415-*a* (e.g., $V_{GUTT}$ or $V_{GUTB}$, as identified in FIG. 5) reaches a threshold associated with the voltage isolation characteristic of the low voltage portion 430-*a*. Thus, until such a threshold is reached, $V_{DL}$, $V_{GUTT}$, and $V_{GUTRT}$ are substantially equal, and $V_{GUTB}$ and $V_{GUTRB}$ are substantially equal. $V_5$ may be selected to selectively isolate the low voltage portion 430-*a* from relatively high voltage signals, permitting the sense component 130-*c* to employ components having a relatively low voltage isolation characteristic in the low voltage portion 430-*a*.

In some examples the voltage $V_5$ may be selected according to voltages associated with input/output operations. For example, when employing certain legacy DRAM input/output architectures associated with a 0V-1V signal range, $V_5$ may be selected according to the threshold voltage of clamping arrangement, such as the pair of n-type transistors 512-*a* and 512-*b*, to support a 1V output voltage (e.g., where the nominal activation for the n-type transistors 512-*a* and 512-*b* is equal to 0.15V, $V_5$ may be selected to be equal to 1.15V).

At 701, the access procedure may include isolating the sense component 130-*c* from a ground voltage. For example, at 701 the access procedure may include deactivating switching components 531-*c* and 531-*d* (e.g., by deactivating logical signals $SW_2$ and $SW_3$, which may be provided by a common logical signal). Deactivating switching components 531-*c* and 531-*d* may isolate the low voltage portion 430-*a* from voltage source 265-*i* (e.g., floating the associated conductors of the low voltage portion 430-*a* from a ground voltage), which may support the development of signals described herein. In some examples the access procedure may also include deactivating switching component 531-*a* (e.g., by deactivating logical signal $SW_6$) to also isolate the voltage source 265-*j* from the low voltage portion 430-*a*.

At 702, the access procedure may include raising the cell plate voltage of the memory cell 105-*b*. For example, at 702 the access procedure may include activating the voltage switching component 545 (e.g., by activating logical signal $SW_1$). Activating voltage switching component 545 may cause a transition from the voltage source 265-*g* being coupled with the plate line 215-*b* to the voltage source 265-*h* being coupled with the plate line 215-*b*. Thus, after activating the voltage switching component 545, plate line voltage $V_{PL}$ may rise from $V_0$ to $V_1$.

At 703, the access procedure may include selecting the memory cell 105-*b* (e.g., by activating a word line via logical signal WL). Selecting the memory cell 105-*b* may cause a capacitor of the memory cell 105-*b* to be coupled with the digit line 210-*b*. Accordingly, the voltage applied across the capacitor (e.g., $V_{cap}$ described with reference to FIG. 3) may initially be equal to $(V_{DL}-V_{PL})$, a negative $V_{cap}$, and charge may be shared between the memory cell 105-*c*, the digit line 210-*b*, and any intrinsic capacitance of the digit line, which may depend on the logic state (e.g., the charge and/or polarization) stored in the memory cell 105-*b*. Charge may be accordingly shared until reaching an equilibrium digit line voltage $V_{DL}$ for the given plate line voltage $V_{PL}=V_1$, the charge state of the memory cell 105-*b*, and the intrinsic capacitance of the digit line 210-*b*.

For example, when the memory cell 105-*b* stores a logic 0, the capacitor of the memory cell 105-*b* may store a negative charge by way of a positive polarization (e.g., a charge state 305-*a* as described with reference to FIG. 3). Thus, when memory cell 105-*b* storing a logic 0 is selected, the memory cell 105-*b* may support a relatively small amount of charge flowing from the memory cell 105-*b* to the digit line 210-*b* with a relatively large change in capacitor voltage $V_{cap}$. Accordingly, the resulting digit line voltage $V_{DL}$ may be relatively low (e.g., lower than a reference voltage) when accessing the memory cell 105-*b* when the memory cell 105-*b* initially stores a logic 0. The clamping voltage $V_5$ may be selected such that the pair of n-type transistors 512-*a* and 512-*b* remain conductive during these operations, such that, following the selection of the memory cell 105-*b*, $V_{GUTT}$ and $V_{GUTRT}$ may also rise to the same level as digit line voltage $V_{DL}$. In some examples the majority of charge flow may pass through the n-type transistor 512-*a*, rather than the p-type transistor 513-*a* (e.g., because the p-type transistor may be in a state, such as a deactivated state). Thus, the voltage represented by $V_{TOP}$ may remain at substantially a pre-charged level (e.g., a ground or virtual ground voltage level of 0V) in response to the operations of 703.

At 704, the access procedure may include generating a reference voltage at the sense component 130-*c*. For example, at 704 the access procedure may include activating the switching component 531-*f* (e.g., by activating logical signal $SW_9$), coupling the voltage source 265-*m* with the pair of cross-coupled n-type transistors 532-*a* and 532-*b*. Activating switching component 531-*f* may cause the voltage $V_{GUTRB}$ to rise from an initial voltage (e.g., 0V) to the voltage level $V_6$. In the example of accessing the memory cell 105-*b* initially storing a logic 0 state, generating the reference voltage at the sense component 130-*c* results in the voltage $V_{GUTRB}$ being greater than the voltage $V_{GUTRT}$.

At 705, the access procedure may include isolating the sense component 130-*c* from the digit line. For example, at 705 the access procedure may include deactivating the switching component 511-*b* (e.g., by deactivating logical signal $SW_8$). Deactivating switching component 511-*b* may cause the voltage $V_{GUTT}$ to be held at the level associated with reading the memory cell 105-*b* (e.g., reading the logic 0 state of the memory cell 105-*b*).

At 706, the access procedure may include isolating the reference voltage from the sense component 130-*c*. For example, at 706 the access procedure may include deactivating the switching component 531-*f* (e.g., by deactivating logical signal SW$_9$). In some examples, deactivating switching component 531-*f* may cause the voltage V$_{GUTRB}$ to be held at the same value (e.g., 0V).

At 707, the access procedure may include enabling the pair of n-type transistors 532-*a* and 532-*b* of the low voltage portion 430-*a*, which may be referred to as turning on the n-sense portion of the sense component 130-*c*. For example, at 707 the access procedure may include activating the switching component 531-*a* (e.g., by activating logical signal SW$_6$), coupling the pair of n-type transistors 532-*a* and 532-*b* with the voltage source 265-*j*. In the example of accessing the memory cell 105-*b* initially storing a logic 0 state, because the voltage V$_{GUTRT}$ is less than the voltage V$_{GUTRB}$ prior to 706, V$_{GUTRT}$ may drop to voltage level V$_3$ (e.g., 0V) upon turning on the n-sense portion of the sense component 130-*c*. For example, when the voltage difference (V$_{GUTRB}$–V$_3$) is greater than the activation threshold voltage of the n-type transistor 532-*a*, transistor 532-*a* may be activated, thereby allowing charge to flow from the node of V$_{GUTRT}$ through the n-type transistor 532-*a* such that V$_{GUTRT}$ drops to V$_3$. When (V$_{GUTRT}$– V$_3$) is not greater than the activation threshold voltage of the n-type transistor 532-*b*, transistor 532-*b* may be deactivated, such that the voltage of V$_{GUTRB}$ is maintained at the same level (e.g., not dropping to V$_3$). Thus, in order to improve sense margins of the sense component 130-*c*, it may be advantageous for the n-type transistors 532-*a* and 532-*b* to have relatively low activation voltage thresholds in order to respond to relatively small voltage differences between V$_{GUTRB}$ and V$_3$ or V$_{GUTRT}$ and V$_3$ when enabling the pair of n-type transistors 532-*a* and 532-*b* at 706. When the clamping voltage source 265-*l* remains enabled (e.g., supporting conduction across the n-type transistor 512-*b*), V$_{GUTT}$ may also drop to voltage level V$_3$ upon turning on the n-sense portion of the sense component 130-*c*.

At 708, the access procedure may include enabling the pair of p-type transistors 513-*a* and 513-*b* of the high voltage portion 410-*a*, which may be referred to as turning on the p-sense portion of the sense component 130-*c*. For example, at 708 the access procedure may include activating the switching component 511-*a* (e.g., by activating logical signal SW$_7$), coupling the pair of p-type transistors 513-*a* and 513-*b* with the voltage source 265-*k*. In the example of accessing the memory cell 105-*b* initially storing a logic 0 state, because the voltage V$_{GUTB}$ is greater than the voltage V$_{GUTR}$ prior to 708, V$_{GUTB}$ may rise to voltage level V$_4$ (e.g., 1.6V) upon activating the p-sense portion of the sense component 130-*c*. For example, when the voltage difference (V$_{GUTT}$–V$_4$) has a negative magnitude that is greater than the activation threshold voltage of the p-type transistor 513-*b*, transistor 513-*b* may be activated (e.g., conductive), thereby allowing charge to flow from voltage source 265-*k* to the node of V$_{GUTB}$ through the p-type transistor 513-*b* such that V$_{GUTB}$ rises to V$_4$. When (V$_{GUTB}$–V$_4$) does not have a negative magnitude that is greater than the activation threshold voltage of the p-type transistor 513-*a*, p-type transistor 513-*a* may be deactivated (e.g., non-conductive), such that the voltage of V$_{GUTT}$ is maintained at the same level (e.g., holding at V$_3$). Thus, in order to improve sense margins of the sense component 130-*c*, it may be advantageous for the p-type transistors 513-*a* and 513-*b* to have relatively low activation voltage thresholds in order to respond to relatively small voltage differences between V$_{GUTB}$ and V$_4$ or V$_{GUTT}$ and V$_4$ when enabling the pair of p-type transistors 513-*a* and 513-*b* at 708.

However, in some examples it may be less important for the p-type transistors 513-*a* and 513-*b* to have low activation threshold voltages (e.g., less important than the n-type transistors 532-*a* and 532-*b* having low activation threshold voltages), because in some examples V$_4$ may be selected such that the difference between V$_4$ and V$_{GUTT}$ or V$_{GUTB}$ when sensing logic states of the memory cell 105-*b* is relatively high (e.g., greater than the difference between V$_{GUTRT}$ and V$_{GUTRB}$ when sensing the memory cell 105-*b*). Thus, by isolating components of the low-voltage portion 430-*a* from relatively higher voltage signals in accordance with the present disclosure, the high voltage portion 410-*a* may support components operating with relatively higher voltage activation thresholds (e.g., as supported by voltage source 265-*k* having voltage level V$_4$) while still supporting relatively wide sense margins of the sense component 130-*c*.

When the clamping voltage source 265-*l* remains enabled (e.g., supporting conduction across the n-type transistor 512-*b*), V$_{GUTRB}$ may also rise upon turning on the p-sense portion of the sense component 130-*c*. However, as shown, V$_{GUTRB}$ may not rise to the same voltage level as V$_{GUTB}$. For example, according to the activation properties of the n-type transistor 512-*b*, V$_{GUTRB}$ may only rise to a level of (V$_5$–V$_{TH}$), where V$_{TH}$ is the threshold activation voltage of the n-type transistor 512-*b*. In other words, when V$_{GUTT}$ exceeds (V$_5$–V$_{TH}$), the n-type transistor 512-*b* may be deactivated such that conduction across the n-type transistor 512-*b* is no longer supported. Accordingly, the n-type transistor 512-*b* in the boundary portion 415-*a* may isolate the low voltage portion 430-*a* from the relatively higher voltage of V$_{GUTB}$. Thus, the signal associated with V$_{GUTB}$ may be an example of a first sense signal for a first portion (e.g., high voltage portion 410) of the sense component 130-*c* based at least in part on accessing memory cell 105-*b*, the first sense signal having a first voltage (e.g., V$_4$). The signal associated with V$_{GUTRB}$ may be an example of a second sense signal for a second portion (e.g., low voltage portion 430) of the sense component 130-*c*, the second sense signal based at least in part on the first sense signal and having a second voltage (e.g., V$_5$–V$_{TH}$) that is less than the first voltage. The operations of 708 may also be an example of, or otherwise support determining a logic state stored by the memory cell 105-*b* based at least in part on the second sense signal (e.g., the signal associated with V$_{GUTRB}$).

Further, the described read signals may also be an example of providing a first set of signals via a first portion of a sense component (e.g., the signals associated with the voltage V$_{GUTB}$), the first set of signals being within a first voltage range (e.g., having a voltage range of 0-1.6V) associated with access operations of a set of logic states of a memory cell, and the first portion of the sense component comprising transistors having first voltage isolation characteristic; and providing a second set of signals via a second portion of the sense component (e.g., the signals associated with the voltage V$_{GUTRB}$, carried via the low voltage portion 430), the second set of signals being in a second voltage range (e.g., having a voltage range of 0-1V) associated with communicating the set of logic states of the memory cell with an input/output component 140, the second voltage range being less than the first voltage range, and the second portion of the sense component comprising transistors having a second voltage isolation characteristic that is less than the first voltage isolation characteristic.

At 709, the access procedure may include activating the output of the sense component 130-*c*. For example, at 709 the access procedure may include activating switching components 531-*b* and 531-*e* (e.g., by activating logical signals SW$_4$ and SW$_5$, which may be provided by a common logical signal). Activating switching components 531-*b* and 531-*e* may couple the sense component 130-*c* with an input/output component 140 (not shown), providing V$_{GUTRB}$ (e.g., (V$_5$−V$_{TH}$), or approximately 1V) to the input/output component 140 via input/output line 290-*c*, and providing voltage V$_{GUTRT}$ (e.g., 0V) to the input/output component 140 via input/output line 290-*b*. Thus, the operations of 708 may be an example of, or otherwise support determining a logic state stored by the memory cell 105-*b* based at least in part on the second sense signal (e.g., the signal associated with V$_{GUTRB}$).

At 710, the access procedure may include the input/output component 140 providing an output of accessing the memory cell 105-*b*, which in some examples may be followed by cell restore operations (e.g., the operations of 710 and 711). In some examples the output of the sense component 130-*c* may be deactivated shortly after activating the output of the sense component 130-*c* at 709, based at least in part on a transferring pulse width. For example, logical signals SW$_4$ and SW$_5$ may be activated for a transferring pulse width of 2-3 nanoseconds before being deactivated (not shown).

At 711, the access procedure may include a "low" cell restore operation. For example, at 711 the access procedure may include activating switching component 511-*b* (e.g., by activating logical signal SW$_8$), which may connect the sense component 130-*c* with the digit line 210-*b*. Accordingly, charge may flow from the digit line 210-*b* as fed by voltage source 265-*j*, and the digit line voltage V$_{DL}$ may drop to the voltage level V$_3$. Accordingly, the voltage across the capacitor (e.g., V$_{cap}$) may be equal to (V$_1$−V$_3$), which may re-write the memory cell 105-*b* to a logic 0 state (although in some cases reading the logic 0 state may not be a destructive read process, therefore operations of 711 may not be required for such a rewrite).

At 712, the access procedure may include a "high" cell restore operation. For example, at 712 the access procedure may include deactivating voltage switching component 545 (e.g., by deactivating logical signal SW$_1$). Deactivating voltage switching component 545 may cause a transition from the voltage source 265-*h* being coupled with the plate line 215-*b* to the voltage source 265-*g* being coupled with the plate line 215-*b*. Thus, after deactivating the voltage switching component 545, plate line voltage V$_{PL}$ may drop from V$_1$ to V$_0$.

In some embodiments, write operations for the memory cell 105-*b* may incorporate some or all of the operations of 711 and 712. For example, an input/output component 140 may provide write signals to the sense component 130-*b* via input/output lines 290-*b* and 290-*c* in order to write a logic state to the memory cell 105-*b*. To write a logic 0 state, the input/output component 140 may provide a relatively high input/output voltage (e.g., V$_5$−V$_{TH}$, which may be equal to 1V) to the sense component 130-*c* via the input/output line 290-*c*, and provide a relatively low input/output voltage (e.g., V$_3$, which may be equal to 0V) to the sense component 130-*c* via the input/output line 290-*b*, which may be substantially the same as voltages associated with reading the logic 0 state. In response to being provided these input/output voltages from the input/output component 140, the sense component 130-*c* may output a relatively low write voltage (e.g., V$_3$, which may be equal to 0V) to the memory cell 105-*b* via digit line 210-*b*. In some examples, the write operation may also include providing a relatively high write voltage (e.g., V$_1$, which may be equal to 1.6V) to the memory cell 105-*b* via plate line 215-*b*, such that the voltage difference across the memory cell 105-*b* is equal to −1.6V. Thus, similar to the refresh operations of 711 and 712, the memory cell may be written with a logic 0 state.

The described write operations may be an example of providing a first set of signals via a first portion of a sense component (e.g., the signals to the memory cell 105-*b*, carried via the high voltage portion 410), the first set of signals being within a first voltage range (e.g., having a voltage range of 0-1.6V) associated with access operations of a set of logic states of a memory cell, and the first portion of the sense component comprising transistors having first voltage isolation characteristic; and providing a second set of signals via a second portion of the sense component (e.g., the signals from an input/output component 140, carried via the low voltage portion 430), the second set of signals being in a second voltage range (e.g., having a voltage range of 0-1V) associated with communicating the set of logic states of the memory cell with an input/output component, the second voltage range being less than the first voltage range, and the second portion of the sense component comprising transistors having a second voltage isolation characteristic that is less than the first voltage isolation characteristic.

At 713, the access procedure may include isolating the memory cell 105-*b* from the sense component 130-*c*. For example, at 713 the access procedure may include deactivating a selection component of the memory cell 105-*b* by deactivating the logical signal WL.

At 714, the access procedure may include grounding the input/output of the low voltage portion 430-*a*. For example, at 714 the access procedure may include activating the switching components 531-*c* and 531-*d* (e.g., by activating logical signals SW$_2$ and SW$_3$). Activating switching components 531-*c* and 531-*d* may cause the voltage V$_{GUTRB}$ to drop to the voltage level V$_2$ (e.g., 0V). In examples where the clamping voltage source 265-*l* remains activated, activating switching components 531-*c* and 531-*d* may also cause the voltage V$_{GUTB}$ to drop to the voltage level V$_2$.

Although illustrated as separate operations occurring at different times, certain operations may occur simultaneously, or in a different order. In some examples, various operations may be advantageously initiated simultaneously in order to reduce the amount of time required to sense a logic state of the memory cell 105-*b*. For example, enabling the variable voltage source 540 at 702 and selecting the memory cell 105-*b* at 703 may occur in an opposite order, or simultaneously (e.g., when logical signals SW$_1$ and WL are driven simultaneously). Additionally or alternatively, selecting the memory cell 105-*b* at 703 and activating the reference voltage source 265-*m* at 704 may occur in opposite order, or simultaneously (e.g., when logical signals WL and SW$_9$ are activated simultaneously). Additionally or alternatively, isolating the sense component 130-*c* from the digit line 210-*b* at 705 and deactivating the reference voltage source 265-*m* at 706 may occur in opposite order, or simultaneously (e.g., when logical signals SW$_8$ and SW$_9$ are deactivated simultaneously).

The order of operations shown in timing diagram 700 is for illustration only, and various other orders and combinations of steps may be performed to support sense amplifier schemes for accessing memory cells in accordance with the present disclosure. Further, the timing of the operations of timing diagram 700 is also for illustration purposes only, and is not meant to indicate a particular relative duration between one operation and another. Various operations may occur over a duration that is relatively shorter or relatively longer than illustrated in various embodiments of self-boost in accordance with the present disclosure.

The transitions of the logical signals of the timing diagram 700 are illustrative of transitions from one state to another, and generally reflect transitions between a disabled or deactivated state (e.g., state "0") and an enabled or activated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a ramping behavior, or time-constant (e.g., logarithmic) behavior over time from one logical state to another. In some examples the transition of a component from one state to another may be based at least in part on characteristics of the associated logical signal, including the voltage level of the logical signal or the transition characteristics of the logical signal itself. Thus, the transitions shown in timing diagram 700 are not necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

Figure 8:
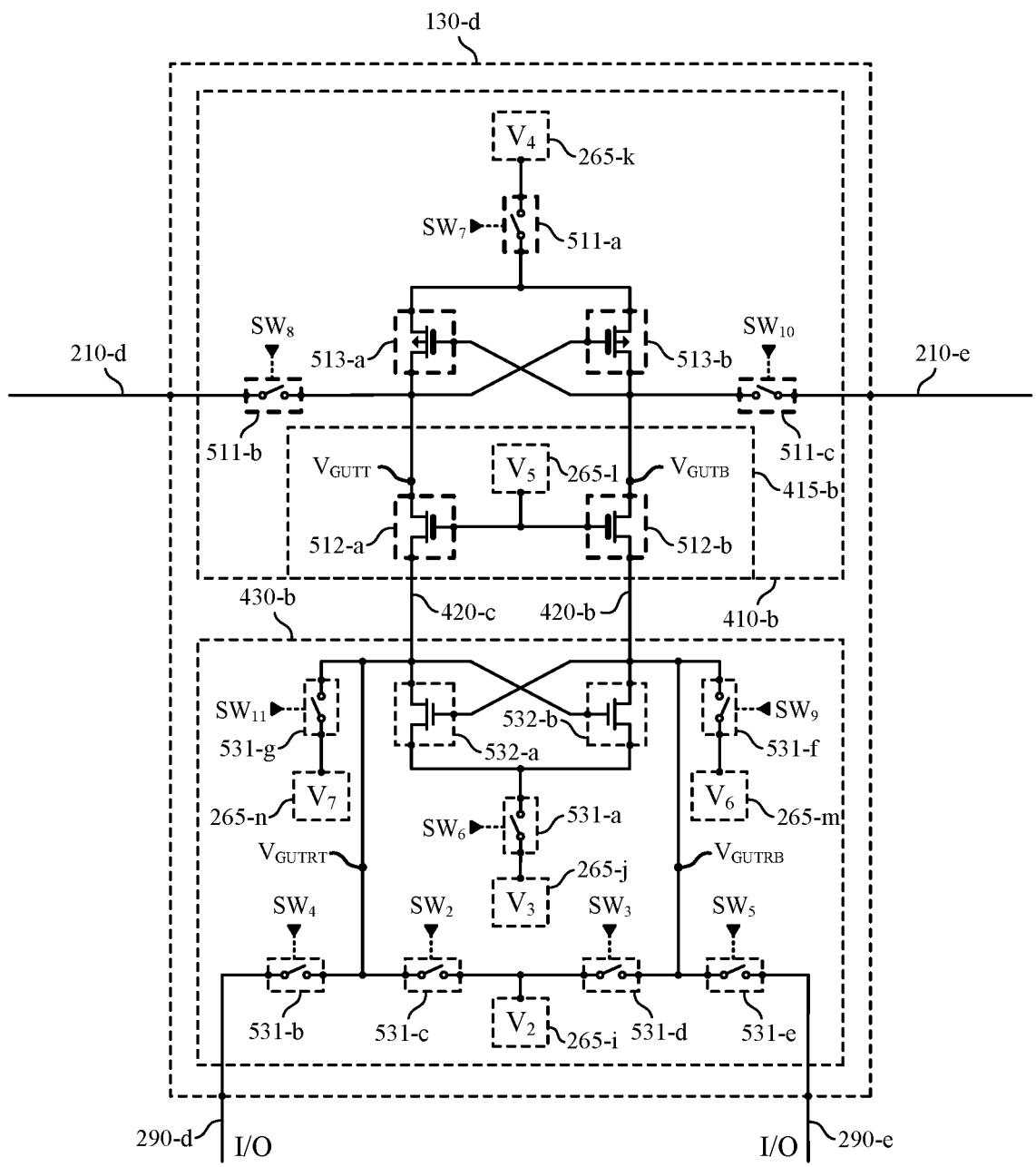
FIG. 8 illustrates an example of a circuit that may support sense amplifier schemes for accessing memory cells in accordance with various embodiments of the present disclosure.

FIG. 8 illustrates an example of a circuit 800 that may support sense amplifier schemes for accessing memory cells in accordance with various embodiments of the present disclosure. The circuit 800 includes a sense component 130-d, which may include components generally similar to those of the sense component 130-c as described with reference to FIG. 5. However, sense component 130-d may include additional components that support sensing logic states of two memory cells 105 (not shown), where a first memory cell 105 may be coupled with the first digit line 210-d and a second memory cell may be coupled with the second digit line 210-e. Electrical signals may be communicated between the sense component 130-c and an input output component 140 (not shown) via input/output lines 290-d and 290-e. The memory cells 105 may be associated with access operations having a higher voltage magnitude than input/output operations, such as those associated with a device that accesses an FeRAM memory cell 105 and employs a legacy DRAM input/output architecture.

The sense component 130-d may include a high voltage portion 410-b and a low voltage portion 430-b. The high voltage portion 410-b may be coupled between the memory cells 105 and the low voltage portion 430-b, and the low voltage portion 430-b may be coupled between the input/output component 140 and the high voltage portion 410-b. The high voltage portion 410-a may be coupled with the low voltage portion 430-a by intermediate lines 420-c and 420-d, which may be substantially the same as the intermediate lines 420-a and 420-b described with reference to sense component 130-c. The intermediate lines 420-c and 420-d may be coupled with a boundary portion 415-b (e.g., of the high voltage portion 410-b). The high voltage portion 410-b may include components having relatively a higher voltage isolation characteristic, and the low voltage portion 430-b may include components having a relatively lower voltage isolation characteristic.

The high voltage portion 410-b of the sense component 130-d may include components that are generally the same as the high voltage portion 410-a of the sense component 130-c. For example, the high voltage portion 410-b may be coupled with the first digit line 210-d via a switching component 511-b having the relatively higher voltage isolation characteristic, and the switching component 511-b may be activated or deactivated by a logical signal $SW_8$. However, to support accessing a second memory cell 105, the high voltage portion 410-b may also be coupled with a second digit line 210-e via a switching component 511-c having the relatively higher voltage isolation characteristic, and the switching component 511-c may be activated or deactivated by a logical signal $SW_{10}$. When accessing a memory cell 105 with the sense component 130-d via the second digit line 210-e, the operations associated with logical signal $SW_8$ described with reference to FIGS. 6 and 7 may be swapped with operations associated with the logical signal $SW_{10}$.

The boundary portion 415-b of the sense component 130-d may include components that are generally the same as the boundary portion 415-a of the sense component 130-c.

The low voltage portion 430-b of the sense component 130-d may include components that are generally the same as the low voltage portion 430-a of the sense component 130-c. For example, the low voltage portion 430-b may be coupled with the input/output line 290-d via switching component 531-b having the relatively lower voltage isolation characteristic, and the switching component 531-b may be activated or deactivated by a logical signal $SW_4$. The low voltage portion 430-b may be coupled with the input/output line 290-e via switching component 531-e having the relatively lower voltage isolation characteristic, and the switching component 531-e may be activated or deactivated by a logical signal $SW_5$.

The low voltage portion 430-b may also include a voltage source 265-m having a voltage $V_6$, which in some examples may be coupled with a reference voltage source. Voltage source 265-m may be coupled with the pair of cross-coupled n-type transistors 532-a and 532-b via a switching component 531-f which may have the relatively lower voltage characteristic, and the switching component 531-f may be activated or deactivated by a logical signal $SW_9$. The voltage source 265-m may be coupled with a reference voltage supply outside the sense component 130-b via a reference line 270 (not shown), which may be an example of a reference line 270 coupled with the sense component 130-d at the low voltage portion 430-a. To support accessing a second memory cell 105, the high voltage portion 410-b may also include a voltage source 265-n having a voltage $V_7$. Voltage source 265-n may be coupled with the pair of cross-coupled n-type transistors 532-a and 532-b via a switching component 531-g which may have the relatively lower voltage characteristic, and the switching component 531-g may be activated or deactivated by a logical signal $SW_{11}$. In various examples the voltage source 265-n may be coupled with a same reference voltage source or a different reference voltage source as the voltage source 265-m. For example, the voltage source 265-n may be coupled with a reference voltage supply outside the sense component 130-d via the same a reference line 270 or a different reference line 270 as the voltage source 265-m.

Each of the logical signals (e.g., $SW_1$ through $SW_{11}$) illustrated in timing diagram 600 may be provided by a memory controller (not shown), such as a memory controller 150 described with reference to FIG. 1. In some examples, certain logical signals may be provided by other components.

In the example of sense component 130-*d*, the relative voltage of input/output lines 290-*d* and 290-*e* may be swapped depending on whether a memory cell 105 is being read via the first digit line 210-*d* or via the second digit line 210-*e*. For example, when reading a logic state 1 (e.g., charge state 305-*a* described with reference to FIG. 3) via digit line 210-*d*, input/output line 290-*d* may have a relatively high read voltage (e.g., 1V) and input/output line 290-*e* may have a relatively low read voltage (e.g., 0V). When reading a logic state 1 (e.g., charge state 305-*a* described with reference to FIG. 3) via digit line 210-*e*, input/output line 290-*d* may have a relatively low read voltage (e.g., 0V) and input/output line 290-*e* may have a relatively high read voltage (e.g., 1V). Thus, in some embodiments a memory controller (e.g., memory controller 150 described with reference to FIG. 1), or some other component, may reverse the interpretation of input/output lines 290-*d* and 290-*e* depending on which of digit lines 210-*d* or 210-*e* a memory cell 105 is connected with. Alternatively, in some embodiments the charge state associated with a logic state may be reversed depending on which of digit lines 210-*d* or 210-*e* a memory cell 105 is connected with. For example, a memory cell 105 connected with digit line 210-*d* having charge state 305-*a* described with reference to FIG. 3 may correspond to a logic 1 state, and a memory cell 105 connected with digit line 210-*e* having charge state 305-*a* described with reference to FIG. 3 may correspond to a logic 0 state. Various embodiments of sense components 130 having multiple digit lines 210 may incorporate these or other logical compensations to support access operations and input/output operations in accordance with the present disclosure.

Figure 9:
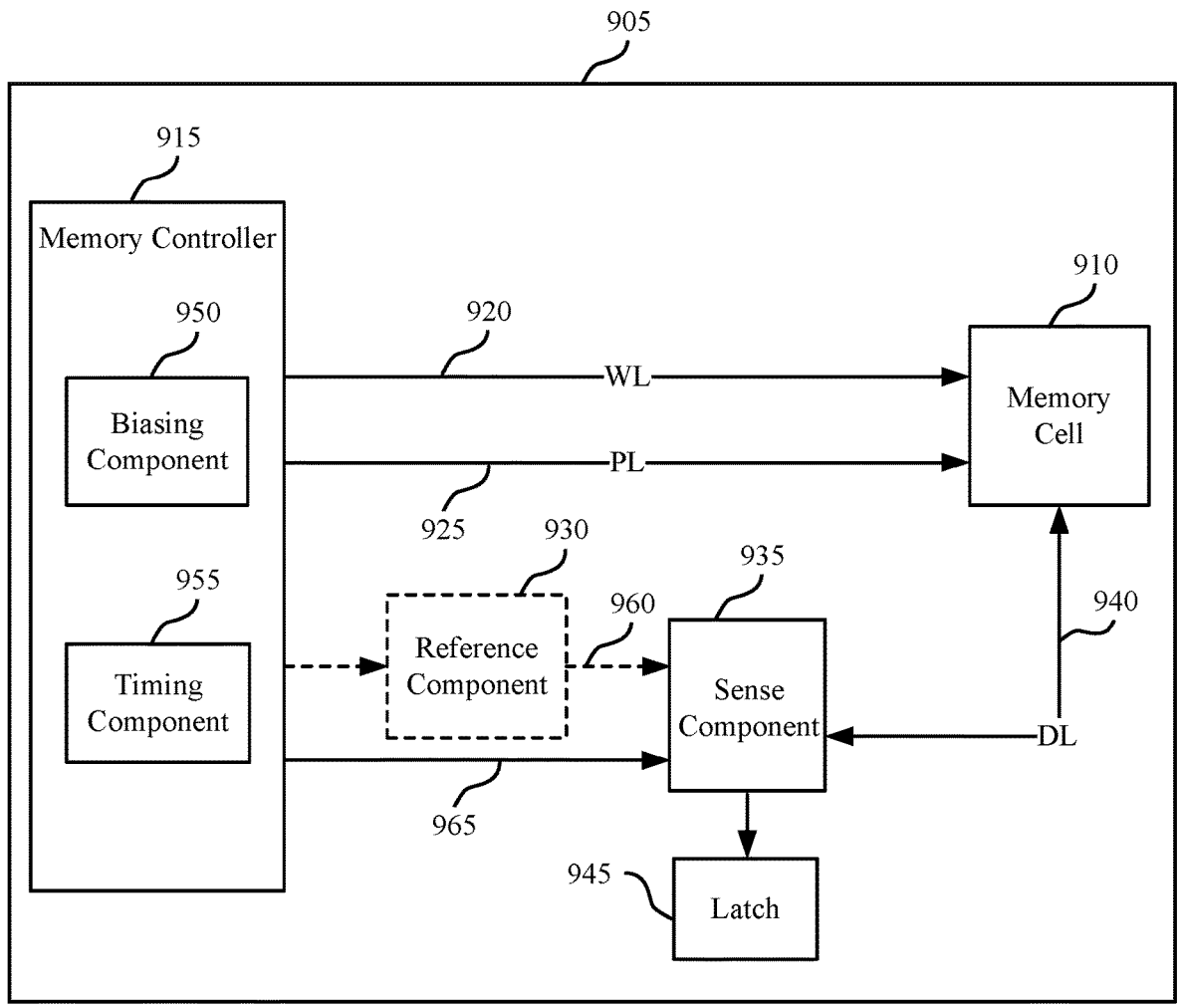
FIG. 9 shows a block diagram of a memory device that may support sense amplifier schemes for accessing memory cells in accordance with various embodiments of the present disclosure.

FIG. 9 shows a block diagram 900 of a memory device 905 that may support sense amplifier schemes for accessing memory cells in accordance with various embodiments of the present disclosure. Memory device 905 may be referred to as an electronic memory apparatus, and may be an example of a component of a memory device 100 as described with reference to FIG. 1.

Memory device 905 may include one or more memory cells 910, which may be an example of memory cells 105 described with reference to FIGS. 1 through 8. Memory device 905 may also include a memory controller 915, a word line 920, a plate line 925, a sense component 935, and a digit line 940. These components may be in electronic communication with each other and may perform one or more of the functions described herein. In some cases, memory controller 915 may include biasing component 950 and timing component 955.

Memory controller 915 may be in electronic communication with word line 920, digit line 940, plate line 925, and sense component 935, which may be examples of a word line 205, a digit line 210, a plate line 215, and a sense component 130 described with reference to FIGS. 1 through 8. In some examples the memory device 905 may also include reference component 930 and latch 945, which may be an example of an input/output component 140 as described herein. The components of memory device 905 may be in electronic communication with each other and may perform embodiments of the functions described with reference to FIGS. 1 through 8. In some cases, reference component 930, sense component 935, or latch 945 may be components of memory controller 915.

In some examples, digit line 940 is in electronic communication with sense component 935 and a ferroelectric capacitor of a memory cell 910. A memory cell 910 may be writable with a logic state (e.g., a first or second logic state). Word line 920 may be in electronic communication with memory controller 915 and a selection component of memory cell 910. Plate line 925 may be in electronic communication with memory controller 915 and a plate of the ferroelectric capacitor of memory cell 910. Sense component 935 may be in electronic communication with memory controller 915, digit line 940, latch 945, and reference line 960. Reference component 930 may be in electronic communication with memory controller 915 and reference line 960. Some examples may omit reference component 930, and may generate a reference via the memory cell 910. In some examples, the digit line 940 may provide the functions of reference line 960. Sense control line 965 may be in electronic communication with sense component 935 and memory controller 915. These components may also be in electronic communication with other components, both inside and outside of memory device 905, in addition to components not listed above, via other components, connections, or busses.

Memory controller 915 may be configured to activate word line 920, plate line 925, or digit line 940 by applying voltages to various nodes. For example, biasing component 950 may be configured to apply a voltage to operate memory cell 910 to read or write memory cell 910 as described above. In some cases, memory controller 915 may include a row decoder, column decoder, or both, as described with reference to FIG. 1, which may enable memory controller 915 to access one or more memory cells 105. Biasing component 950 may also provide voltage potentials to reference component 930, or memory cell 910, in order to generate a reference signal for sense component 935. Additionally or alternatively, biasing component 950 may provide voltage potentials for the operation of sense component 935.

In some cases, memory controller 915 may perform its operations using timing component 955. For example, timing component 955 may control the timing of the various word line selections or plate biasing, including timing for switching and voltage application to perform the memory functions, such as reading and writing, discussed herein (e.g., in accordance with operations described with reference to timing diagrams 600 and 700 of FIGS. 6 and 7). In some cases, timing component 955 may control the operations of biasing component 950.

Reference component 930 may include various components to generate a reference signal for sense component 935. Reference component 930 may include circuitry configured to produce a reference signal. In some cases, reference component 930 may be implemented using other memory cells 910. Sense component 935 may compare a signal from memory cell 910 (e.g., via digit line 940) with a reference signal from reference component 930, or from another signal from the digit line 940. Upon determining the logic state, the sense component 935 may then store the output in latch 945, where it may be used in accordance with the operations of an electronic device that includes the memory device 905. Sense component 935 may include a sense amplifier in electronic communication with the latch and the ferroelectric memory cell.

Memory controller 915 and/or at least some of its various sub-components may be implemented in hardware, software executed by a processor, firmware, or any combination thereof. If implemented in software executed by a processor, the functions of the memory controller 915 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 915 and/or at least some of its various sub-components may be physically located at various positions, including being distributed such that portions of functions are implemented at different physical locations by one or more physical devices. In some examples, memory controller 915 and/or at least some of its various sub-components may be a separate and distinct component in accordance with various embodiments of the present disclosure. In other examples, memory controller 915 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure. Memory controller 915 may be an example of the memory controller 1115 described with reference to FIG. 11.

In some examples, the memory controller 915, including any subcomponents thereof, may support generating a first sense signal for a first portion of a sense component based at least in part on accessing a memory cell, the first sense signal having a first voltage; generating a second sense signal for a second portion of the sense component, the second sense signal based at least in part on the first sense signal and having a second voltage that is less than the first voltage; and determining a logic state stored by the memory cell based at least in part on the second sense signal.

In some examples the memory controller 915, including any subcomponents thereof, may support providing a first set of signals via a first portion of a sense component, the first set of signals being within a first voltage range associated with access operations of a set of logic states of a memory cell, and the first portion of the sense component comprising transistors having first voltage isolation characteristic; and providing a second set of signals via a second portion of the sense component, the second set of signals being in a second voltage range associated with communicating the set of logic states of the memory cell with an input/output component, the second voltage range being less than the first voltage range, and the second portion of the sense component comprising transistors having a second voltage isolation characteristic that is less than the first voltage isolation characteristic.

Figure 10:
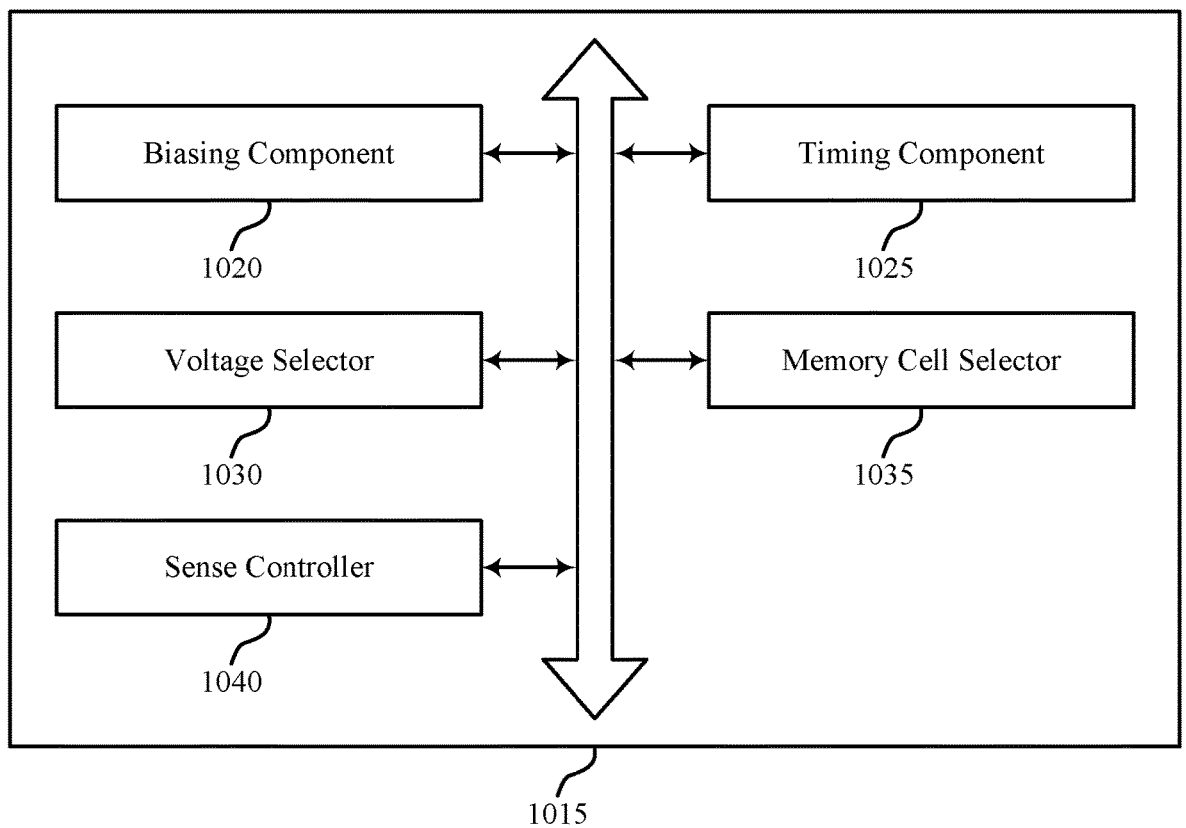
FIG. 10 shows a block diagram of a memory controller that may support sense amplifier schemes for accessing memory cells in accordance with various embodiments of the present disclosure.

FIG. 10 shows a block diagram 1000 of a memory controller 1015 that may support sense amplifier schemes for accessing memory cells in accordance with various embodiments of the present disclosure. The memory controller 1015 may be an example of a memory controller 150 described with reference to FIG. 1 or a memory controller 915 described with reference to FIG. 9. The memory controller 1015 may include a biasing component 1020 and a timing component 1025, which may be examples of biasing component 950 and timing component 955 described with reference to FIG. 9. The memory controller 1015 may also include a voltage selector 1030, a memory cell selector 1035, and a sense controller 1040. Each of these modules may communicate, directly or indirectly, with one another (e.g., via one or more buses).

Voltage selector 1030 may initiate the selection of voltage sources to support various access operations of a memory device. For example, the voltage selector 1030 may generate logical signals used to activate or deactivate various switching components, such as switching components 511 described with reference to FIGS. 5 and 8. For example, the voltage selector 1030 may generate one or more of the logical signals for selecting (e.g., enabling or disabling) voltage sources of timing diagrams 600 or 700 described with reference to FIGS. 6 and 7.

Memory cell selector 1035 may select a memory cell for sensing operations. For example, the memory cell selector 1035 may generate logical signals used to activate or deactivate a selection component, such as selection component 250 described with reference to FIG. 2. For example, the memory cell selector 1035 may generate the word line logical signals of timing diagrams 600 or 700 described with reference to FIGS. 6 and 7.

Sense controller 1040 may control various operations of a sense component, such as sense components 130 described with reference to FIGS. 1 through 8. For example, the sense controller 1040 may generate logical signals used to activate or deactivate a sense component isolation component, such as switching components 511-b, 511-c, 531-b, or 531-e described with reference to FIGS. 5 and 8. In some examples the sense controller 1040 may generate logical signals used to couple or decouple a voltage source with cross-coupled pairs of transistors of a sense component, which may include activating or deactivating switching components such as switching components 511-a or 531-a described with reference to FIGS. 5 and 8. In some examples the sense controller 1040 may generate logical signals used to couple or decouple a sense component with a ground voltage, which may include activating or deactivating switching components such as switching components 531-c or 531-d described with reference to FIGS. 5 and 8. Thus, in various examples the sense controller 1040 may generate the logical signals $SW_2$, $SW_3$, $SW_4$, $SW_5$, $SW_6$, $SW_7$, or $SW_8$, or any combination thereof, of timing diagrams 600 or 700 described with reference to FIGS. 6 and 7.

In some embodiments the sense controller 1040 may compare a resultant voltage of a first access line to a reference voltage at the sensing component, where the resultant voltage is based on selecting the memory cell for the sensing operation. The sense controller 1040 may determine a logic value associated with the memory cell based on comparing the resultant voltage and the reference voltage at the sensing component. In some examples the sense controller 1040 may provide signals to another component to determine the logic value associated with the memory cell.

Figure 11:
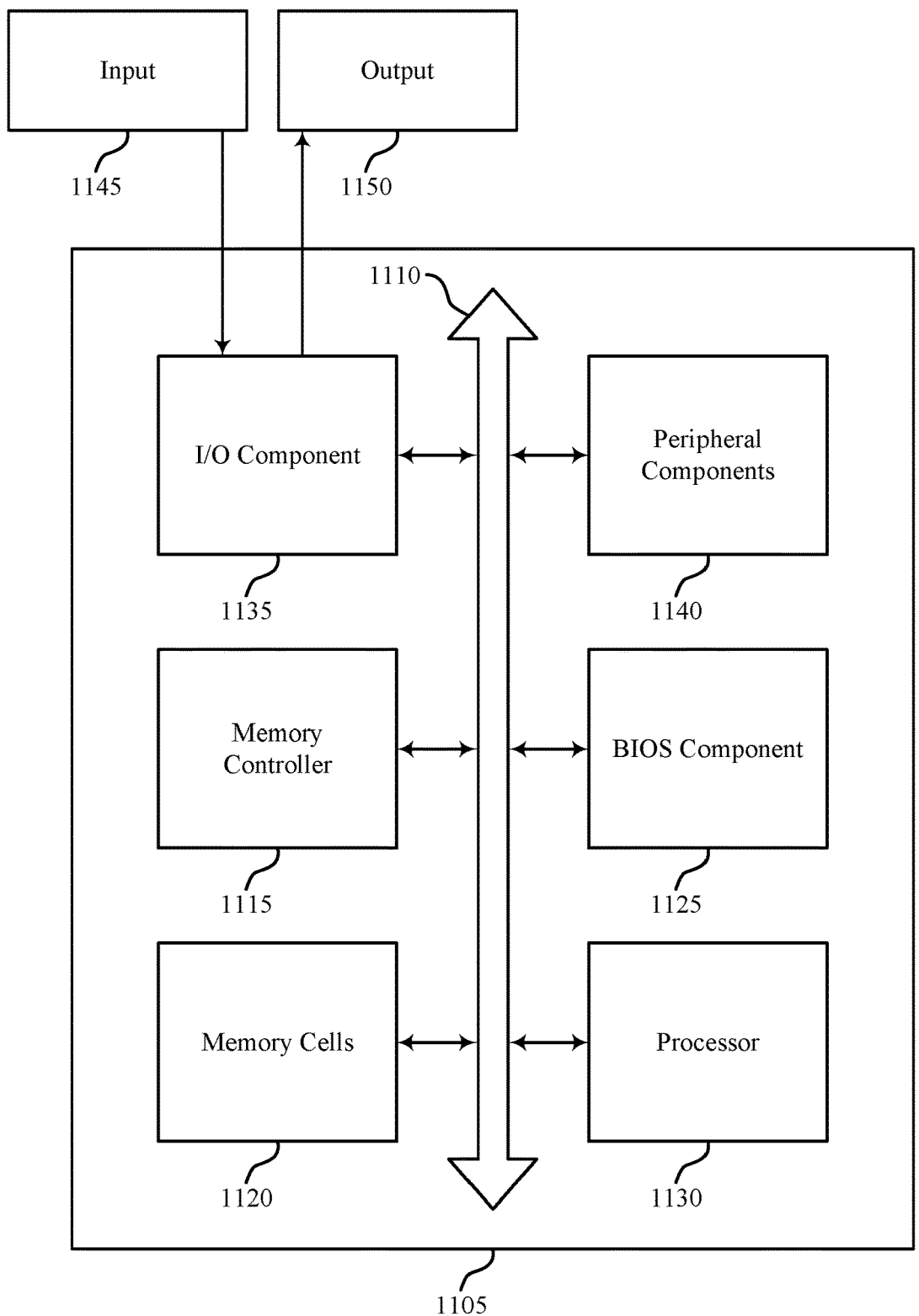
FIG. 11 shows a diagram of a system including a device that may support sense amplifier schemes for accessing memory cells in accordance with various embodiments of the present disclosure.

FIG. 11 shows a diagram of a system 1100 including a device 1105 that may support sense amplifier schemes for accessing memory cells in accordance with various embodiments of the present disclosure. Device 1105 may be an example of or include the components of memory device 100 as described above, e.g., with reference to FIG. 1. Device 1105 may include components for bi-directional communications including components for transmitting and receiving communications, including memory controller 1115, memory cells 1120, basic input/output system (BIOS) component 1125, processor 1130, I/O component 1135, and peripheral components 1140. These components may be in electronic communication via one or more busses (e.g., bus 1110).

Memory controller 1115 may operate one or more memory cells as described herein. Specifically, memory controller 1115 may be configured to support the described sense amplifier schemes for accessing memory cells. In some cases, memory controller 1115 may include a row decoder, column decoder, or both, as described with reference to FIG. 1 (not shown).

Memory cells 1120 may be an example of memory cells 105 or 910 described with reference to FIGS. 1 through 11, and may store information (i.e., in the form of a logical state) as described herein.

BIOS component 1125 be a software component that includes BIOS operated as firmware, which may initialize and run various hardware components. BIOS component 1125 may also manage data flow between a processor and various other components, such as peripheral components, input/output control components, and others. BIOS component 1125 may include a program or software stored in read only memory (ROM), flash memory, or any other non-volatile memory.

Processor 1130 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1130 may be configured to operate a memory array using a memory controller. In other cases, a memory controller may be integrated into processor 1130. Processor 1130 may be configured to execute computer-readable instructions stored in a memory to perform various functions (e.g., functions or tasks supporting sense amplifier schemes for accessing memory cells).

I/O component 1135 may manage input and output signals for device 1105. I/O component 1135 may also manage peripherals not integrated into device 1105. In some cases, I/O component 1135 may represent a physical connection or port to an external peripheral. In some cases, I/O component 1135 may utilize an operating system such as iOS®, ANDROID®, MS-DOS®, MS-WINDOWS®, OS/2®, UNIX®, LINUX®, or another known operating system. In other cases, I/O component 1135 may represent or interact with a modem, a keyboard, a mouse, a touchscreen, or a similar device. In some cases, I/O component 1135 may be implemented as part of a processor. In some cases, a user may interact with device 1105 via I/O component 1135 or via hardware components controlled by I/O component 1135. The I/O component 1135 may support accessing the memory cells 1120, including receiving information associated with the sensed logic state of one or more of the memory cells 1120, or providing information associated with writing a logic state of one or more of the memory cells 1120.

Peripheral components 1140 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1145 may represent a device or signal external to device 1105 that provides input to device 1105 or its components. This may include a user interface or an interface with or between other devices. In some cases, input 1145 may be managed by I/O component 1135, and may interact with device 1105 via a peripheral component 1140.

Output 1150 may represent a device or signal external to device 1105 configured to receive output from device 1105 or any of its components. Examples of output 1150 may include a display, audio speakers, a printing device, another processor or printed circuit board, or other devices. In some cases, output 1150 may be a peripheral element that interfaces with device 1105 via peripheral component(s) 1140. In some cases, output 1150 may be managed by I/O component 1135

The components of device 1105 may include circuitry designed to carry out their functions. This may include various circuit elements, for example, conductive lines, transistors, capacitors, inductors, resistors, amplifiers, or other active or inactive elements, configured to carry out the functions described herein. Device 1105 may be a computer, a server, a laptop computer, a notebook computer, a tablet computer, a mobile phone, a wearable electronic device, a personal electronic device, or the like. Or device 1105 may be a portion or element of such a device.

Figure 12:
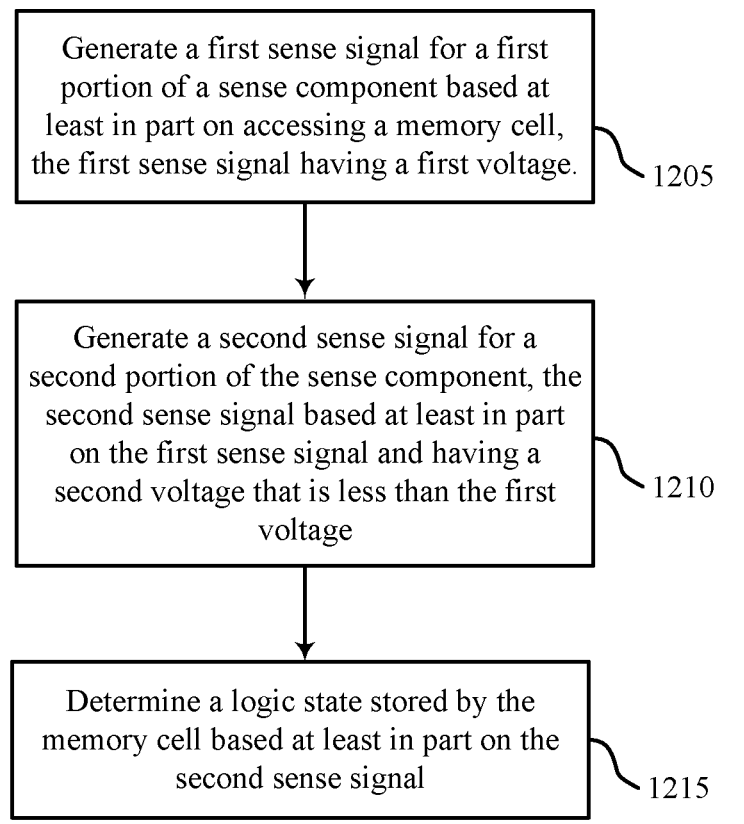
FIG. 12 shows a flowchart illustrating a method that may support sense amplifier schemes for accessing memory cells in accordance with various embodiments of the present disclosure.

FIG. 12 shows a flowchart illustrating a method 1200 that may support sense amplifier schemes for accessing memory cells in accordance with various embodiments of the present disclosure. The operations of method 1200 may be implemented by memory device 100, circuit 500, circuit 800, memory device 905, device 1105, or their components as described herein. For example, operations of method 1200 may be performed at least in part by a memory controller as described with reference to FIGS. 1 through 11. In some examples, a memory device may execute a set of codes to control the functional elements of the device (e.g., voltage supplies, logical signals, transistors, amplifiers, switching components, or selection components) to perform the functions described below. Additionally or alternatively, the memory device may perform some or all of the functions described below using special-purpose hardware. The method 1200 may support an input/output architecture that is associated with lower voltages than the access operations associated with the memory cells. For example, a memory cell accessed by the method 1200 may include a ferroelectric capacitor that is associated with relatively high voltage signals for accessing the memory cell, and the input/output architecture supported by the method 1200 may be associated with relatively low voltage input/output signals. The method 1200 may also support a sense component having different portions with different voltage isolation characteristics that are selected for other reasons.

At 1205 the memory device may generate a first sense signal for a first portion of a sense component based at least in part on accessing a memory cell, the first sense signal having a first voltage. The operations of 1205 may be performed according to the methods and apparatuses described with reference to FIGS. 1 through 11. In various examples, some or all of the operations of 1205 may be performed by a sense component (e.g., sense components 130 or 935 described with reference to FIGS. 1 through 9), a memory controller (e.g., memory controllers 150, 915, 1015, or 1115 described with reference to FIGS. 1 through 11), or one or more portions thereof.

In some examples, generating the first sense signal for the first portion of the sense component at 1205 may include selecting the memory cell (e.g., via a selection component) coupled with the first portion of the sense component. The memory cell may be coupled with the first portion of the sense component via a switching component, and thus generating the first sense signal may include activating the switching component. In some examples generating the first sense signal may include coupling a first voltage source with a cross-coupled pair of transistors (e.g., a cross-coupled pair of p-type transistors) of the first portion of the sense component.

At 1210 the memory device may generate a second sense signal for a second portion of the sense component, the second sense signal based at least in part on the first sense signal and having a second voltage that is less than the first voltage. The operations of 1210 may be performed according to the methods and apparatuses described with reference to FIGS. 1 through 11. In various examples, some or all of the operations of 1210 may be performed by a sense component (e.g., sense components 130 or 935 described with reference to FIGS. 1 through 9), a memory controller (e.g., memory controllers 150, 915, 1015, or 1115 described with reference to FIGS. 1 through 11), or one or more portions thereof.

In some examples, generating the second sense signal for the second portion of the sense component at 1210 may include applying the first sense signal to a pair of transistors of the first portion of the sense component that are configured in a clamping configuration. In some examples, generating the second sense signal for the second portion of the sense component at 1210 may include coupling a second voltage source with a cross-coupled pair of transistors of the first portion of the sense component. In some examples, generating the second sense signal for the second portion of the sense component at 1210 may include converting the first signal to a lower voltage while a switching component (e.g., of a boundary portion of the sense component) is deactivated, and activating the switching component to provide the converted signal (e.g. the second sense signal) to the second portion of the sense component.

At 1215 the memory device may determine a logic state stored by the memory cell based at least in part on the second sense signal. The operations of 1205 may be performed according to the methods and apparatuses described with reference to FIGS. 1 through 11. In various examples, some or all of the operations of 1215 may be performed by a sense component (e.g., sense components 130 or 935 described with reference to FIGS. 1 through 9), a memory controller (e.g., memory controllers 150, 915, 1015, or 1115 described with reference to FIGS. 1 through 11), or one or more portions thereof.

In some examples, determining the logic state stored by the memory cell may include latching output signals at an output terminal (e.g., terminals of input/output lines) of a sense component. In some examples, determining the logic state stored by the memory cell may include identifying a signal at an input/output component, or a signal provided by an input/output component. For example, determining the logic state may include comparing the voltage of one or more input/output lines, where the voltage of the input/output line(s) is based at least in part on the preceding steps of accessing the memory cell.

In some examples, the method 1200 may also include generating a reference signal for the second portion of the sense component (e.g., at the first portion of the sense component or at the second portion of the sense component), and the logic state stored by the memory cell may be determined based at least in part on the reference signal. Generating a reference signal may be performed according to the methods and apparatuses described with reference to FIGS. 1 through 11. In some examples, some or all of the generating of a reference signal may be performed by a biasing component 1020, a timing component 1025, a voltage selector 1030, a memory cell selector 1035, or a sense controller 1040 described with reference to FIG. 10. In some examples generating a reference signal may be performed by a reference component, such as reference component 930 described with reference to FIG. 9.

In some examples, the method 1200 may also include generating a refresh signal based at least in part on the first sense signal, and the refresh signal may have a third voltage that is greater than the second voltage. Generating a refresh signal may be performed according to the methods and apparatuses described with reference to FIGS. 1 through 11. In some examples, some or all of the generating of a refresh signal may be performed by a biasing component 1020, a timing component 1025, a voltage selector 1030, a memory cell selector 1035, or a sense controller 1040 described with reference to FIG. 10. In some examples the refresh signal is not applied to the second portion of the sense component. In some examples the third voltage is equal to the first voltage.

In some examples, the method 1200 may also include generating a write signal (e.g., based at least in part signals received from an input/output component), and the write signal may have a fourth voltage that is greater than the second voltage. Generating a write signal may be performed according to the methods and apparatuses described with reference to FIGS. 1 through 11. In some examples, some or all of the generating of a refresh signal may be performed by a biasing component 1020, a timing component 1025, a voltage selector 1030, a memory cell selector 1035, or a sense controller 1040 described with reference to FIG. 10. In some examples the refresh signal is not applied to the second portion of the sense component. In some examples the third voltage is equal to the first voltage.

Figure 13:
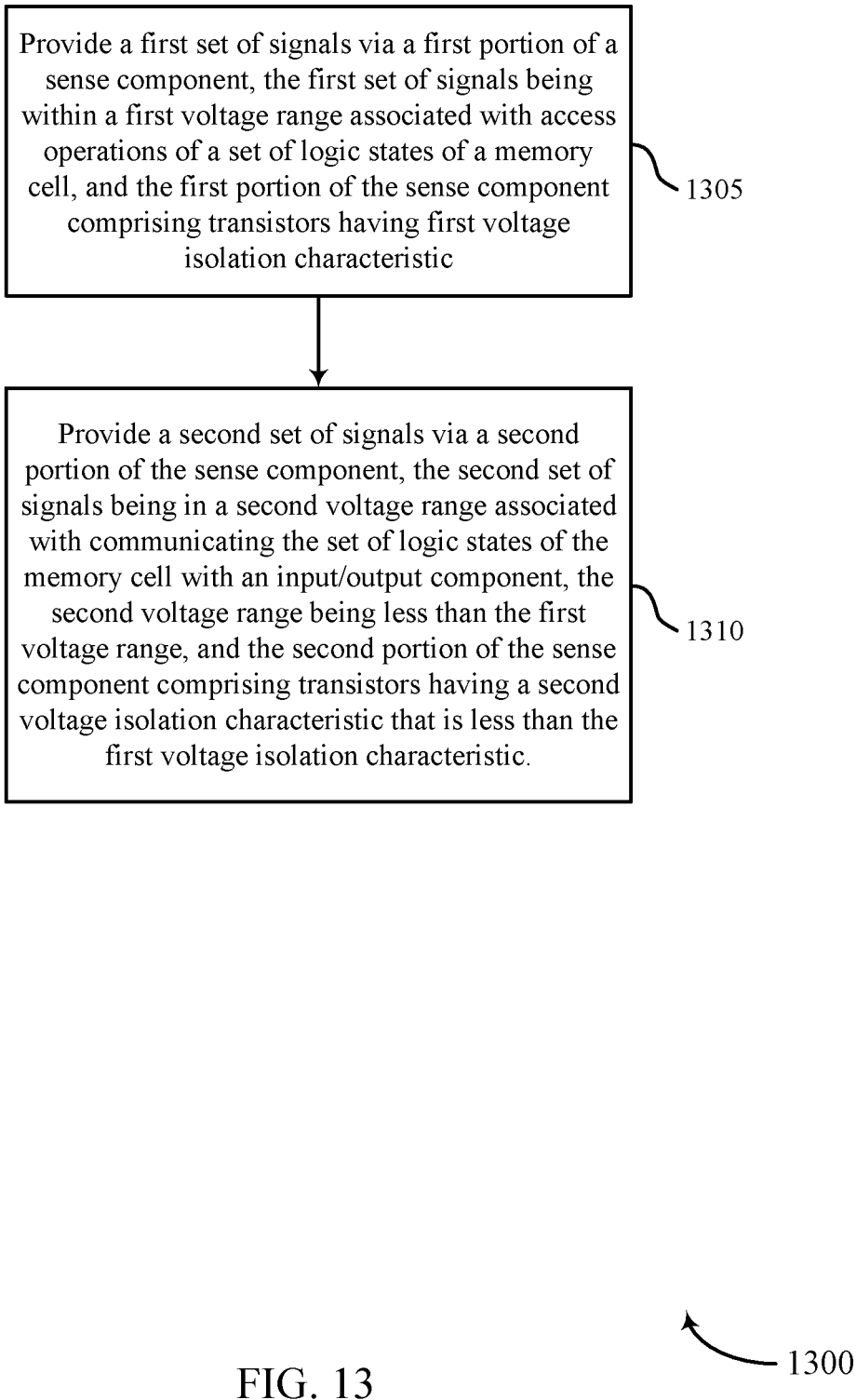
FIG. 13 shows a flowchart illustrating a method that may support sense amplifier schemes for accessing memory cells in accordance with various embodiments of the present disclosure.

FIG. 13 shows a flowchart illustrating a method 1300 that may support sense amplifier schemes for accessing memory cells in accordance with various embodiments of the present disclosure. The operations of method 1300 may be implemented by memory device 100, circuit 500, circuit 800, memory device 905, device 1105, or their components as described herein. For example, operations of method 1300 may be performed at least in part by a memory controller as described with reference to FIGS. 1 through 11. In some examples, a memory device may execute a set of codes to control the functional elements of the device (e.g., voltage supplies, logical signals, transistors, amplifiers, switching components, or selection components) to perform the functions described below. Additionally or alternatively, the memory device may perform some or all of the functions described below using special-purpose hardware. The method 1300 may support an input/output architecture that is associated with lower voltages than the access operations associated with the memory cells. For example, the memory cell accessed by the method 1300 may comprise a ferroelectric capacitor that is associated with relatively high voltage signals for accessing the memory cell, and the input/output architecture supported by the method 1300 may be associated with relatively low voltage input/output signals. The method 1300 may also support a sense component having different portions with different voltage isolation characteristics that are selected for other reasons.

At 1305 the memory device may provide a first set of signals via a first portion of a sense component, the first set of signals being within a first voltage range associated with access operations of a set of logic states of a memory cell, and the first portion of the sense component comprising transistors having first voltage isolation characteristic. The operations of 1305 may be performed according to the methods and apparatuses described with reference to FIGS. 1 through 11. In various examples, some or all of the operations of 1305 may be performed by a sense component (e.g., sense components 130 or 935 described with reference to FIGS. 1 through 9), a memory controller (e.g., memory controllers 150, 915, 1015, or 1115 described with reference to FIGS. 1 through 11), or one or more portions thereof.

In various examples the first set of signals may include write signals, read signals, refresh signals, re-write signals, and the like. In some examples, such as when supporting a memory device that combines accessing FeRAM memory cells with a legacy DRAM input/output architecture, the first voltage range associated with the access operations may be relatively high (as compared with the voltage range of input/output operations). Thus, the first voltage isolation characteristic may support voltage isolation of the relatively high voltage signals of the first voltage range. In one example, the first voltage range associated with access operations may have a magnitude of 1.6V, and therefore the first range may be −1.6V to +1.6V. In such examples, the first voltage isolation characteristic may support voltage isolation of signals in the range of −1.6V to +1.6V.

At 1310 the memory device may provide a second set of signals via a second portion of the sense component, the second set of signals being in a second voltage range associated with communicating the set of logic states of the memory cell with an input/output component, the second voltage range being less than the first voltage range, and the second portion of the sense component comprising transistors having a second voltage isolation characteristic that is less than the first voltage isolation characteristic. The operations of 1310 may be performed according to the methods and apparatuses described with reference to FIGS. 1 through 11. In various examples, some or all of the operations of 1310 may be performed by a sense component (e.g., sense components 130 or 935 described with reference to FIGS. 1 through 9), a memory controller (e.g., memory controllers 150, 915, 1015, or 1115 described with reference to FIGS. 1 through 11), or one or more portions thereof.

In various examples the second set of signals may include output signals following access operations (e.g., a logical signal after performing a read operation to determine a particular logic state of a memory cell), or input signals for performing access operations (e.g., a logical signal provided by a device to write a particular logic state to the memory cell). The second set of signals may also include intermediate signals between an input/output component and the first portion of the sense component (e.g., after activating a pair of cross-coupled transistors). In some examples, such as when supporting a memory device that combines accessing FeRAM memory cells with a legacy DRAM input/output architecture, the second voltage range associated with the access operations may be relatively low (as compared with the voltage range of access operations). Thus, the second voltage isolation characteristic may support voltage isolation of the relatively low voltage signals of the second voltage range, and may not support voltage isolation of the relatively high voltage signals of the first voltage range. In one example, the second voltage range associated with access operations may have a magnitude of 1.0V, and therefore the second voltage range may be −1.0V to +1.0V. In such examples, the second voltage isolation characteristic may support voltage isolation of signals in the range of −1.0V to +1.0V.

In various examples, the described voltage isolation characteristic may refer to one or more properties, or combinations of properties, of the components of the first portion and the second portion of the sense component. For example, the first voltage isolation characteristic may be a first isolation voltage, and the second voltage isolation characteristic may be a second isolation voltage that is less than the first isolation voltage. In another example, the first voltage isolation characteristic may be a first activation threshold voltage (e.g., a threshold voltage of one or more transistors), and the second voltage isolation characteristic may be a second activation threshold voltage that is less than the first activation threshold voltage.

In another example, the first voltage isolation characteristic may be a first degree of insulation between a transistor gate and a transistor body, and the second voltage isolation characteristic may be a second degree of insulation between the transistor gate and the transistor body that is less than the first degree of insulation between the transistor gate and the transistor body. In another example, the first voltage isolation characteristic may be a first degree of insulation between the source and drain of associated transistors, and the second voltage isolation characteristic may be a second degree of insulation between the source and drain of associated transistors that is less than the first degree of insulation between the source and drain of associated transistors.

In some examples, the first voltage isolation characteristic may be based at least in part a first gate insulation thickness, and the second voltage isolation characteristic may be based at least in part a second gate insulation thickness that is less than the first gate insulation thickness. Other examples of voltage isolation characteristics applicable to the described portions of a sense component would be apparent in view of the present disclosure. Further, the described voltage isolation characteristics may refer to a nominal characteristic or a threshold characteristic (e.g., an upper threshold or a lower threshold), and may also include or otherwise account for variations due to manufacturing tolerances, operational tolerances, or any other sources of variation from the nominal or threshold voltage isolation characteristic.

It should be noted that the methods described above describe possible implementations, and that the operations and the steps may be rearranged or otherwise modified and that other implementations are possible. Furthermore, embodiments from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "terminal" need not suggest a physical boundary or connection point of a circuit element. Rather, "terminal" may refer to a reference point of a circuit relevant to the circuit element, which may also be referred to as a "node" or "reference point."

The devices discussed herein, including memory device 100, may be formed on a semiconductor substrate, such as silicon, germanium, silicon-germanium alloy, gallium arsenide, gallium nitride, or others. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be coupled with other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The terms "example," "exemplary," and "embodiment," as used herein mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If the first reference label is used in the specification, the description may be applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

As used herein, the term "substantially" means that the modified characteristic (e.g., a verb or adjective modified by the term substantially) need not be absolute but is close enough so as to achieve the advantages of the characteristic.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An apparatus, comprising:
   a memory cell;
   an input/output component; and
   a sense component comprising:
      a first portion configured to couple with the memory cell, the first portion comprising a first plurality of transistors;
      a second portion configured to couple with the input/output component, the second portion comprising a second plurality of transistors; and
      a third portion coupled with the first portion and the second portion and comprising a third plurality of transistors each having a respective gate that is operable to couple with a voltage source, the third portion configured to:
         isolate the second portion from voltages of first signals of the first portion that are greater than a threshold that is associated with a voltage of the voltage source; and
         generate second signals of the second portion based at least in part on the first signals of the first portion, the second signals having voltages that are less than the threshold that is associated with the voltage of the voltage source.

2. The apparatus of claim 1, wherein:
   the first plurality of transistors are associated with a first voltage isolation characteristic; and
   the second plurality of transistors are associated with a second voltage isolation characteristic different than the first voltage isolation characteristic.

3. The apparatus of claim 1, wherein:
   the first plurality of transistors are associated with a first gate insulation thickness; and
   the second plurality of transistors are associated with a second gate insulation thickness that is less than the first gate insulation thickness.

4. The apparatus of claim 1, wherein:
   the first plurality of transistors comprises:
      a first transistor having a first drain operable to couple with a second voltage source, a first source coupled with the third portion, and a first gate operable to couple the first drain with the first source; and
      a second transistor having a second drain operable to couple with the second voltage source, a second source coupled with the third portion, and a second gate operable to couple the second drain with the second source; and
   the second plurality of transistors comprises:
      a third transistor having a third drain coupled with the third portion, a third source operable to couple with a third voltage source, and a third gate operable to couple the third drain with the third source; and
      a fourth transistor having a fourth drain coupled with the third portion, a fourth source operable to couple with the third voltage source, and a fourth gate operable to couple the fourth drain with the fourth source.

5. The apparatus of claim 4, wherein:
   the first gate is coupled with the second source and the second gate is coupled with the first source; and
   the third gate is coupled with the fourth drain and the fourth gate is coupled with the third drain.

6. The apparatus of claim 4, wherein the third plurality of transistors comprises:
   a fifth transistor having a fifth drain coupled with the first source, a fifth source coupled with the third drain, and a fifth gate operable to couple with the voltage source; and
   a sixth transistor having a sixth drain coupled with the second source, a sixth source coupled with the fourth drain, and a sixth gate operable to couple with the voltage source.

7. The apparatus of claim 6, wherein the voltage of the voltage source is less than a voltage of the second voltage source.

8. The apparatus of claim 4, further comprising:
   a switching component operable to couple the memory cell with the first source.

9. The apparatus of claim 8, further comprising:
a second memory cell; and
a second switching component operable to couple the second memory cell with the second source.

10. The apparatus of claim 4, further comprising:
a third switching component operable to couple a reference voltage with the fourth drain.

11. The apparatus of claim 1, wherein the third portion is configured to support generating the second signals at the second portion with second voltages that are less than the voltages of the first signals.

12. The apparatus of claim 1, wherein the third portion is configured to:
couple the second portion with voltages of the first signals of the first portion that are less than the threshold that is associated with the voltage of the voltage source.

13. The apparatus of claim 1, wherein the third portion is configured to:
limit signals, passing from the first portion to the second portion, to a second voltage of the signals at the second portion that is less than first voltages of the signals at the first portion based at least in part on the voltage of the voltage source.

14. The apparatus of claim 1, wherein the threshold is associated with the voltage of the voltage source and respective activation threshold voltages of the third plurality of transistors.

* * * * *